(12) United States Patent
Cao et al.

(10) Patent No.: US 11,199,633 B2
(45) Date of Patent: Dec. 14, 2021

(54) PACKAGING OF RADIATION DETECTORS

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN); Chongshen Song, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/919,592

(22) Filed: Jul. 2, 2020

(65) Prior Publication Data
US 2020/0333477 A1 Oct. 22, 2020

Related U.S. Application Data

(63) Continuation of application No. PCT/CN2018/074141, filed on Jan. 25, 2018.

(51) Int. Cl.
G01T 1/20 (2006.01)
G01T 1/17 (2006.01)
H01L 31/08 (2006.01)

(52) U.S. Cl.
CPC ............ G01T 1/2002 (2013.01); G01T 1/17 (2013.01); H01L 31/085 (2013.01)

(58) Field of Classification Search
CPC ........ G01T 1/2002; G01T 1/17; H01L 31/085
See application file for complete search history.

(56) References Cited

U.S. PATENT DOCUMENTS

| | | | |
|---|---|---|---|
| 2005/0230629 A1 | 10/2005 | Watanabe et al. | |
| 2007/0002034 A1 | 1/2007 | Hakamata | |
| 2008/0191139 A1* | 8/2008 | Coello | H04N 5/37455 250/370.09 |
| 2010/0116998 A1* | 5/2010 | Kim | G01T 1/2928 250/370.1 |
| 2011/0036989 A1* | 2/2011 | Marks | G01T 1/17 250/370.08 |
| 2011/0121191 A1 | 5/2011 | Kappler et al. | |
| 2012/0193545 A1* | 8/2012 | Tkaczyk | G01T 1/24 250/370.08 |
| 2012/0223241 A1 | 9/2012 | Kim et al. | |
| 2015/0014527 A1* | 1/2015 | Otsuka | H01J 37/244 250/307 |
| 2017/0090048 A1 | 3/2017 | Groepl et al. | |

FOREIGN PATENT DOCUMENTS

| | | |
|---|---|---|
| CN | 1729579 A | 2/2006 |
| CN | 101529274 A | 9/2009 |
| WO | 2016066850 A1 | 5/2016 |
| WO | 2016197338 A1 | 12/2016 |

OTHER PUBLICATIONS

PCT/CN2018/074141 ISA210 ISR dated Oct. 25, 2018.

* cited by examiner

Primary Examiner — Hugh Maupin
(74) Attorney, Agent, or Firm — IPRO, PLLC; Qian Gu

(57) ABSTRACT

Disclosed herein is radiation detector comprising: a radiation absorption layer configured to generate electric signals by absorbing radiation particles; an electronics layer comprising an electronic system configured to process or interpret the signals; a flexible PCB configured to receive output from the electronic system; wherein the radiation absorption layer and the flexible PCB are mounted on a same side of the electronics layer.

21 Claims, 21 Drawing Sheets

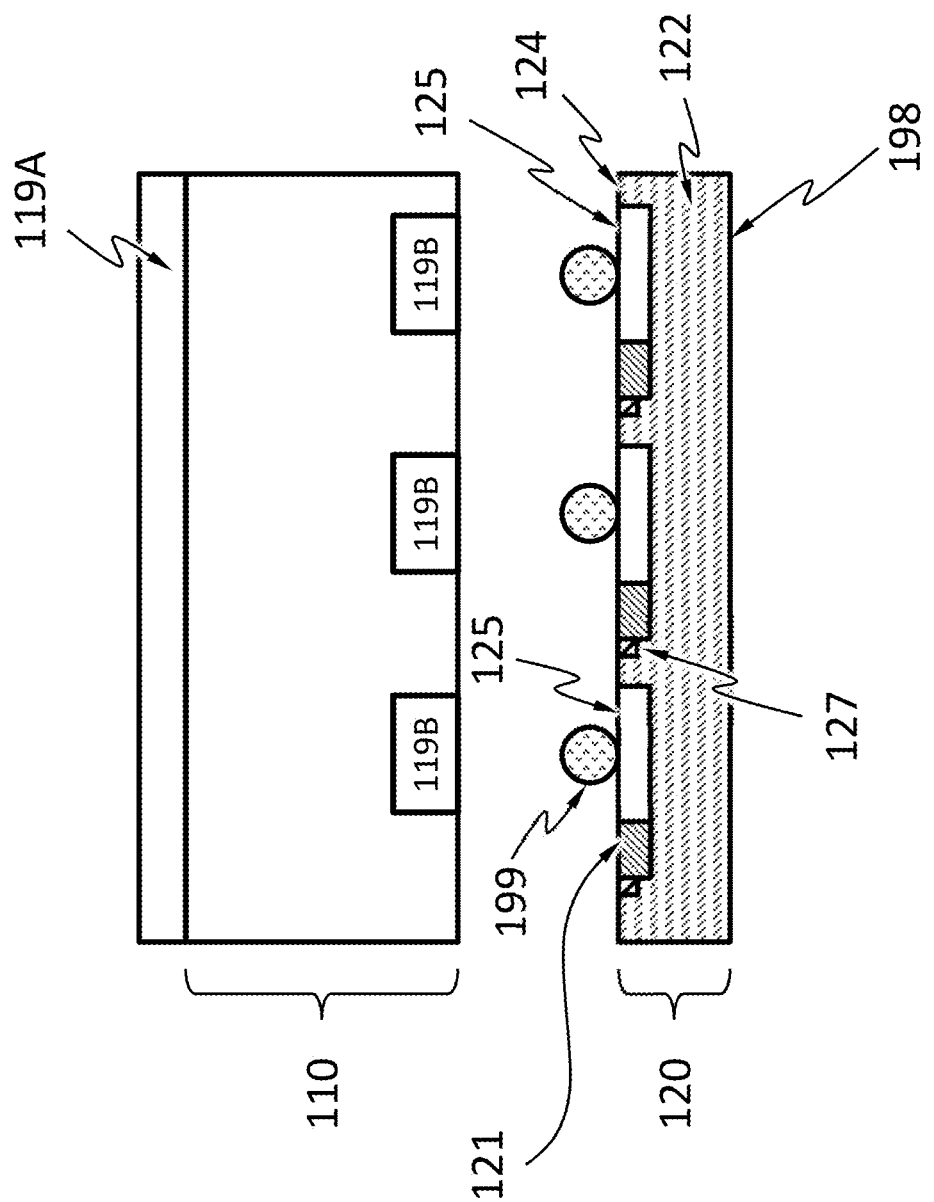

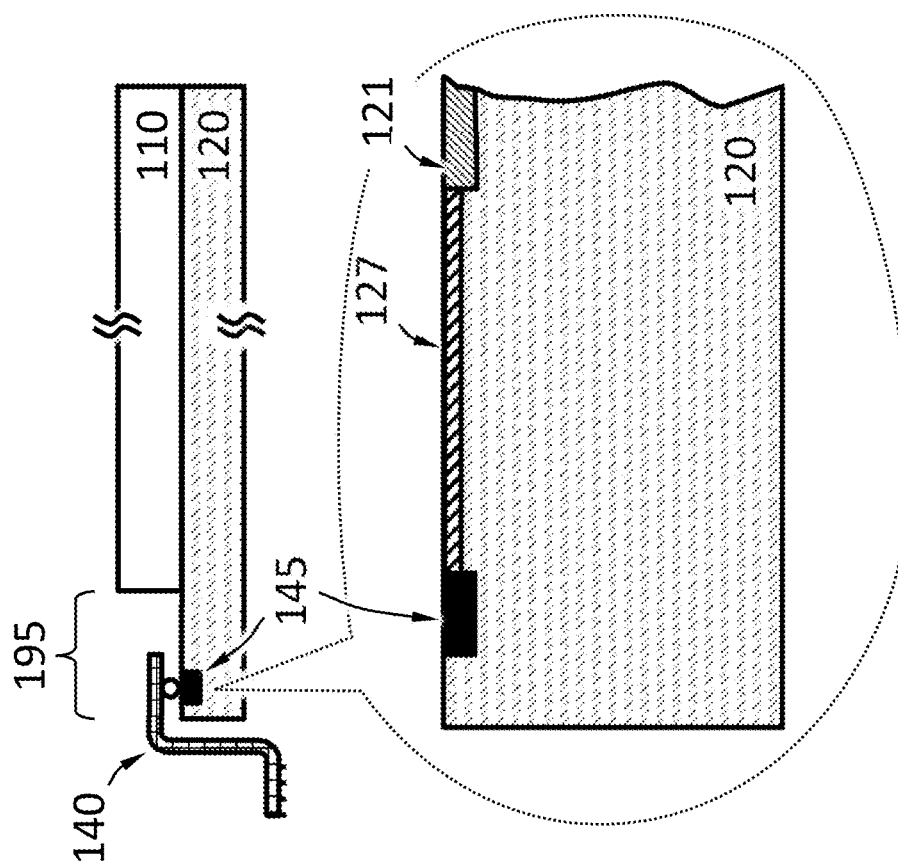
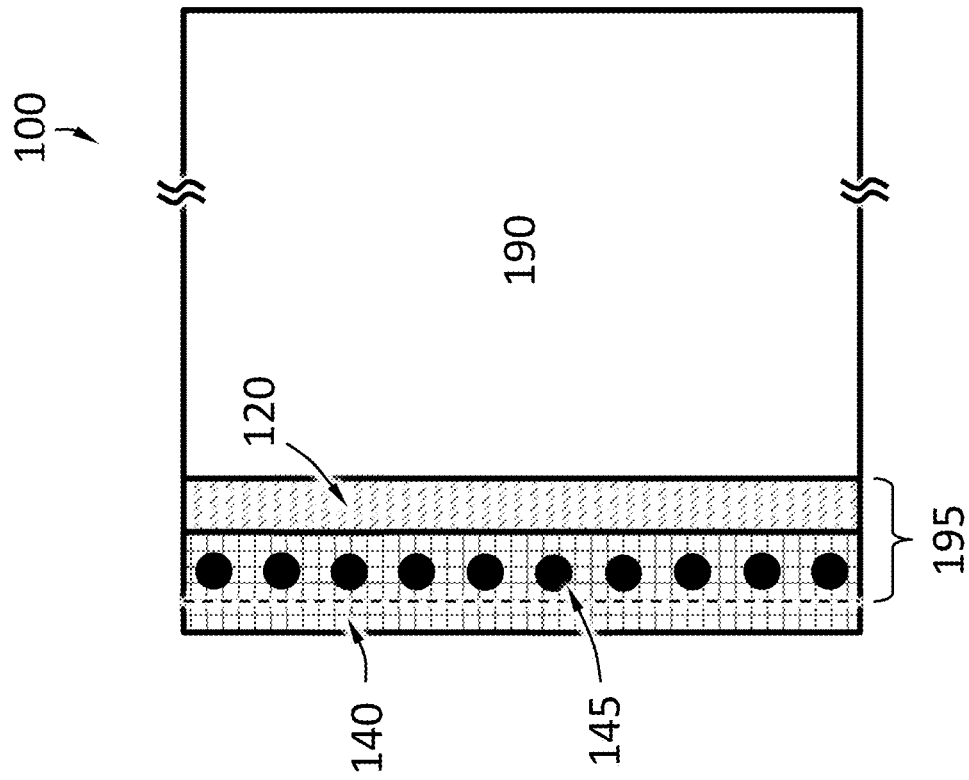
Fig. 4A

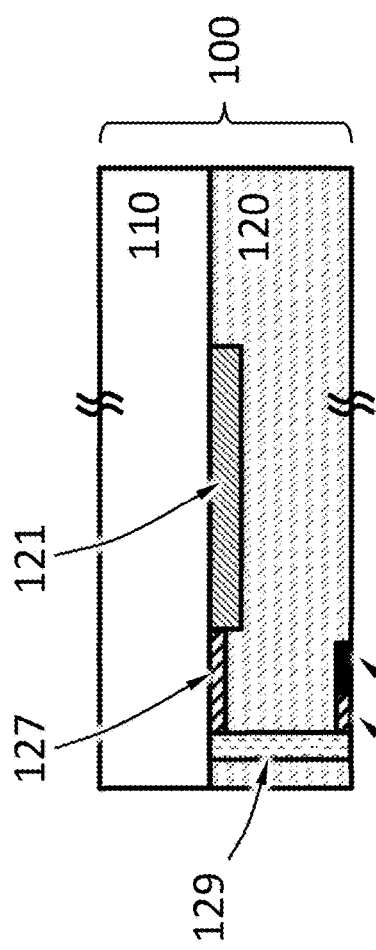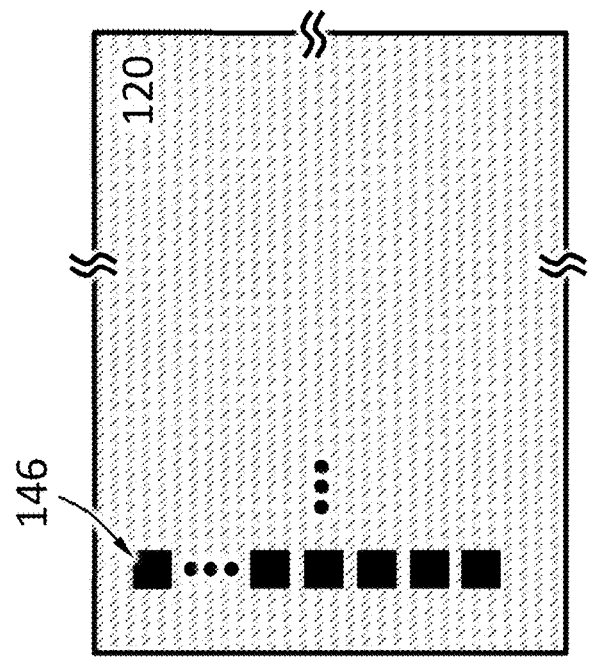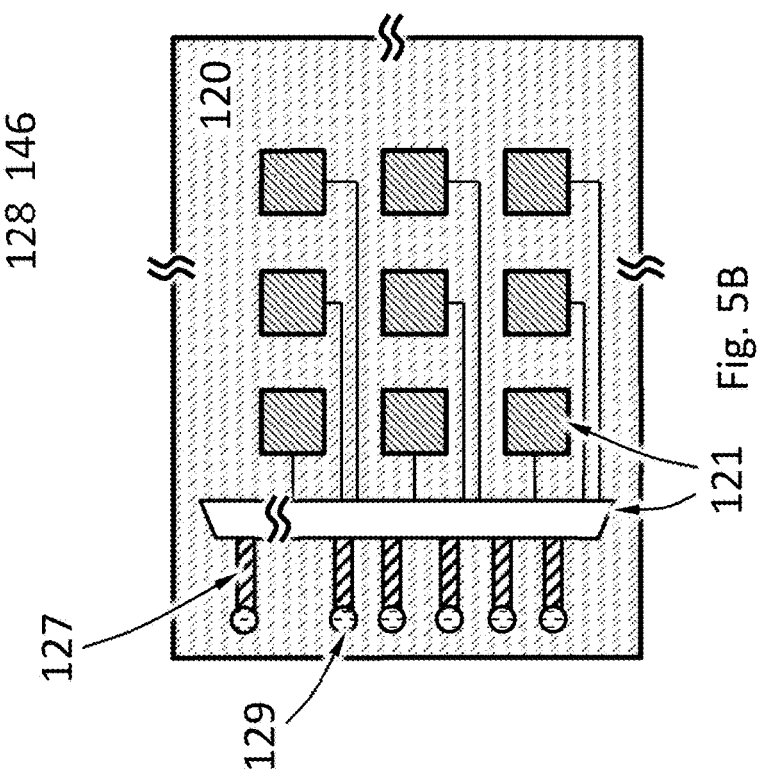

PACKAGING OF RADIATION DETECTORS

TECHNICAL FIELD

The disclosure herein relates to radiation detectors, particularly relates to packaging of radiation detectors with flexible printed circuit board (PCB) or vias.

BACKGROUND

A radiation detector is a device that measures a property of a radiation. Examples of the property may include a spatial distribution of the intensity, phase, and polarization of the radiation. The radiation may be one that has interacted with a subject. For example, the radiation measured by the radiation detector may be a radiation that has penetrated or reflected from the subject. The radiation may be an electromagnetic radiation such as infrared light, visible light, ultraviolet light, X-ray or γ-ray. The radiation may be of other types such as α-rays and β-rays.

One type of radiation detectors is based on interaction between the radiation and a semiconductor. For example, a radiation detector of this type may have a semiconductor layer that absorbs the radiation and generate charge carriers (e.g., electrons and holes) and circuitry for detecting the charge carriers.

SUMMARY

Disclosed herein is a radiation detector comprising: a radiation absorption layer configured to generated electric signals by absorbing radiation particles; an electronics layer comprising an electronic system configured to process or interpret the signals; a flexible PCB configured to receive output from the electronic system, wherein the radiation absorption layer and the flexible PCB are mounted on a same side of the electronics layer.

According to an embodiment, the radiation detector comprises a perimeter zone along one edge of the radiation detector, and wherein the flexible PCB is mounted to the electronics layer at the perimeter zone.

According to an embodiment, the radiation detector does not comprise a perimeter zone along any other edges.

According to an embodiment, the radiation absorption layer of comprises an electrode; the electronic system comprises a first voltage comparator configured to compare a voltage of the electrode to a first threshold, a second voltage comparator configured to compare the voltage to a second threshold, a counter configured to register a number of radiation particles reaching the radiation absorption layer, a controller, wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, when the second voltage comparator determines that an absolute value of the voltage equals or exceeds an absolute value of the second threshold.

According to an embodiment, the electronics system further comprises a capacitor module electrically connected to the electrode, wherein the capacitor module is configured to collect charge carriers from the electrode.

According to an embodiment, the controller is configured to activate the second voltage comparator at a beginning or expiration of the time delay.

According to an embodiment, the electronics system further comprises a voltmeter, wherein the controller is configured to cause the voltmeter to measure the voltage upon expiration of the time delay.

According to an embodiment, the controller is configured to determine a radiation particle energy based on a value of the voltage measured upon expiration of the time delay.

According to an embodiment, the controller is configured to connect the electrode to an electrical ground.

According to an embodiment, a rate of change of the voltage is substantially zero at expiration of the time delay.

According to an embodiment, a rate of change of the voltage is substantially non-zero at expiration of the time delay.

Disclosed herein is an image sensor comprising: a first radiation detector and a second radiation, both mounted on a system PCB; wherein the flexible PCB of the first radiation detector is shadowed by an active area of the second radiation detector.

According to an embodiment, the first radiation detector is tilted relative to the system PCB.

According to an embodiment, the first radiation detector is supported by a fixture between the first radiation detector and the system PCB.

According to an embodiment, the image sensor further comprises a third radiation detector, positioned adjacent to the first radiation detector; wherein a gap between the third radiation detector and the first radiation detector is not wider than a pixel of the first radiation detector.

Disclosed herein is a system comprising the image sensor disclosed herein and a radiation source, wherein the system is configured to perform radiography on human chest or abdomen.

Disclosed herein is a system comprising the image sensor disclosed herein and a radiation source, wherein the system is configured to perform radiography on human mouth.

Disclosed herein is a cargo scanning or non-intrusive inspection (NII) system, comprising the image sensor disclosed herein and a radiation source, wherein the cargo scanning or non-intrusive inspection (NII) system is configured to form an image using backscattered radiation.

Disclosed herein is a cargo scanning or non-intrusive inspection (NII) system, comprising the image sensor disclosed herein and a radiation source, wherein the cargo scanning or non-intrusive inspection (NII) system is configured to form an image using radiation transmitted through an object inspected.

Disclosed herein is a full-body scanner system comprising the image sensor disclosed herein and a radiation source.

Disclosed herein is a radiation computed tomography (Radiation CT) system comprising the image sensor disclosed herein and a radiation source.

Disclosed herein is an electron microscope comprising the image sensor disclosed herein, an electron source and an electronic optical system.

Disclosed herein is a system comprising the image sensor disclosed herein, wherein the system is a radiation telescope, or a radiation microscopy, or wherein the system is configured to perform mammography, industrial defect detection, microradiography, casting inspection, weld inspection, or digital subtraction angiography.

Disclosed herein is a radiation detector comprising: a radiation absorption layer configured to generate electric signals by absorbing radiation particles; an electronics layer comprising an electronic system configured to process or interpret the signals; wherein the radiation absorption layer is mounted on a first side of the electronics layer; wherein the electronics layer comprises a plurality of vias at an edge of the electronics layer, first transmission lines electrically connecting the electronic system to the plurality of vias, and second transmission lines electrically connecting the plurality of vias to a plurality of bonding pads on a second side of the electronics layer opposite the first side.

According to an embodiment, the radiation absorption layer shadows the plurality of vias.

According to an embodiment, the radiation absorption layer comprises an electrode; the electronic system comprises: a first voltage comparator configured to compare a voltage of the electrode to a first threshold; a second voltage comparator configured to compare the voltage to a second threshold; a counter configured to register a number of radiation particles reaching the radiation absorption layer; a controller; wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, when the second voltage comparator determines that an absolute value of the voltage equals or exceeds an absolute value of the second threshold.

According to an embodiment, the electronics system further comprises a capacitor module electrically connected to the electrode, wherein the capacitor module is configured to collect charge carriers from the electrode.

According to an embodiment, the controller is configured to activate the second voltage comparator at a beginning or expiration of the time delay.

According to an embodiment, the electronics system further comprises a voltmeter, wherein the controller is configured to cause the voltmeter to measure the voltage upon expiration of the time delay.

According to an embodiment, the controller is configured to determine a radiation particle energy based on a value of the voltage measured upon expiration of the time delay.

According to an embodiment, the controller is configured to connect the electrode to an electrical ground.

According to an embodiment, a rate of change of the voltage is substantially zero at expiration of the time delay.

According to an embodiment, a rate of change of the voltage is substantially non-zero at expiration of the time delay.

BRIEF DESCRIPTION OF FIGURES

FIG. 3 schematically shows a cross-sectional view of an electronics layer in the radiation detector, according to an embodiment.

FIG. 4A schematically shows a top-view and a cross-sectional view of a radiation detector comprising a radiation absorption layer, an electronics layer, and a flexible PCB, according to an embodiment.

FIG. 5A, FIG. 5B, FIG. 5C respectively schematically show a cross-sectional view, a top view, and a bottom view of a radiation detector, with a plurality of vias, according to an embodiment.

DETAILED DESCRIPTION

Figure 1A:
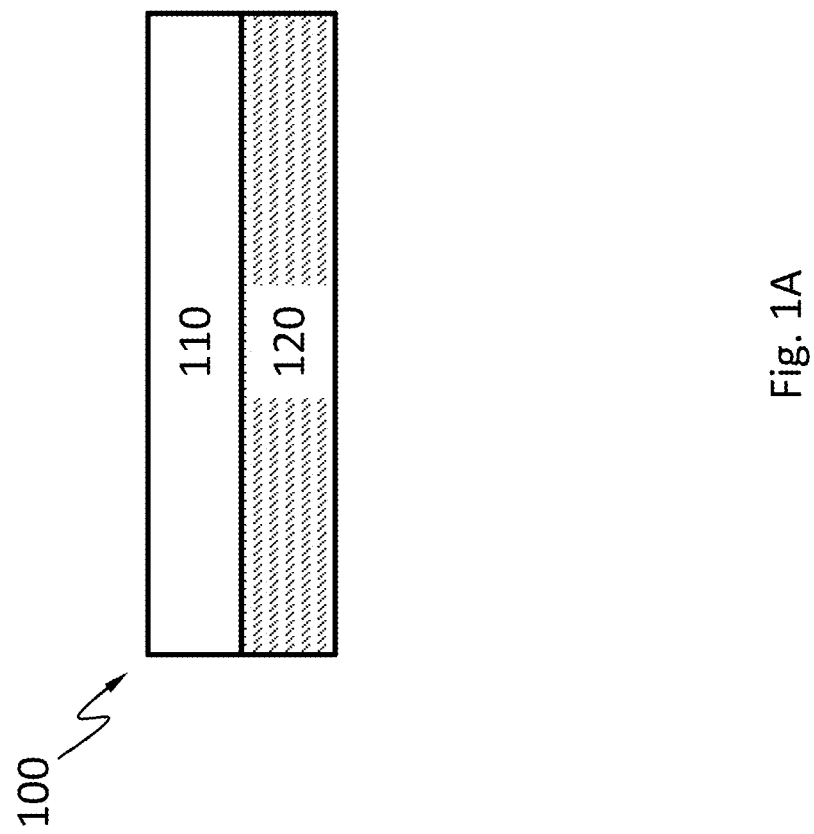
FIG. 1A schematically shows a cross-sectional view of a radiation detector, according to an embodiment.

FIG. 1A schematically shows a cross-sectional view of a radiation detector 100, according to an embodiment. The radiation detector 100 may include a radiation absorption layer 110 and an electronics layer 120 (e.g., an ASIC) for processing or analyzing electrical signals incident radiation generates in the radiation absorption layer 110. In an embodiment, the radiation detector 100 does not comprise a scintillator. The radiation absorption layer 110 may include a semiconductor material such as, silicon, germanium, GaAs, CdTe, CdZnTe, or a combination thereof. The semiconductor may have a high mass attenuation coefficient for the radiation energy of interest.

Figure 1B:
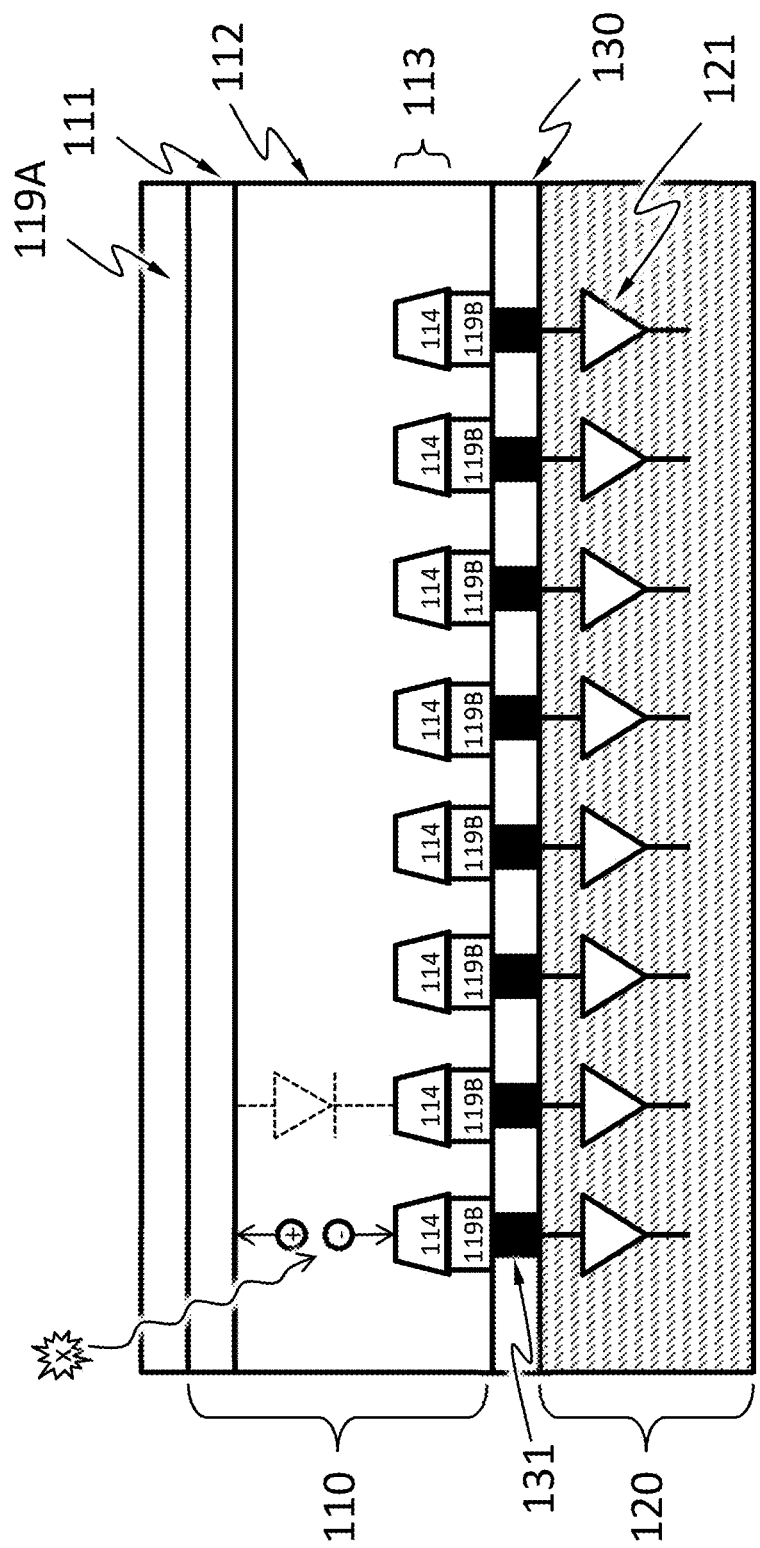
FIG. 1B schematically shows a detailed cross-sectional view of the radiation detector, according to an embodiment.

As shown in a detailed cross-sectional view of the radiation detector 100 in FIG. 1B, according to an embodiment, the radiation absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 1B, each of the discrete regions 114 of the second doped region 113 forms a diode with the first doped region 111 and the optional intrinsic region 112. Namely, in the example in FIG. 1B, the radiation absorption layer 110 has a plurality of diodes having the first doped region 111 as a shared electrode. The first doped region 111 may also have discrete regions.

When a radiation particle hits the radiation absorption layer 110 including diodes, the radiation particle may be absorbed by the radiation absorption layer 110, and one or more charge carriers may be generated in the radiation absorption layer 110 by a number of mechanisms. A radiation particle may generate 10 to 100000 charge carriers. The charge carriers may drift to the electrodes of one of the diodes under an electric field. The field may be an external electric field. The electrical contact 119B may include discrete portions each of which is in electrical contact with the discrete regions 114. In an embodiment, the charge carriers may drift in directions such that the charge carriers generated by a single radiation particle are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a radiation particle incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by a radiation particle incident therein flow to the discrete region 114. Namely, less than 2%, less than 1%, less than 0.1%, or less than 0.01% of these charge carriers flow beyond the pixel.

Figure 1C:
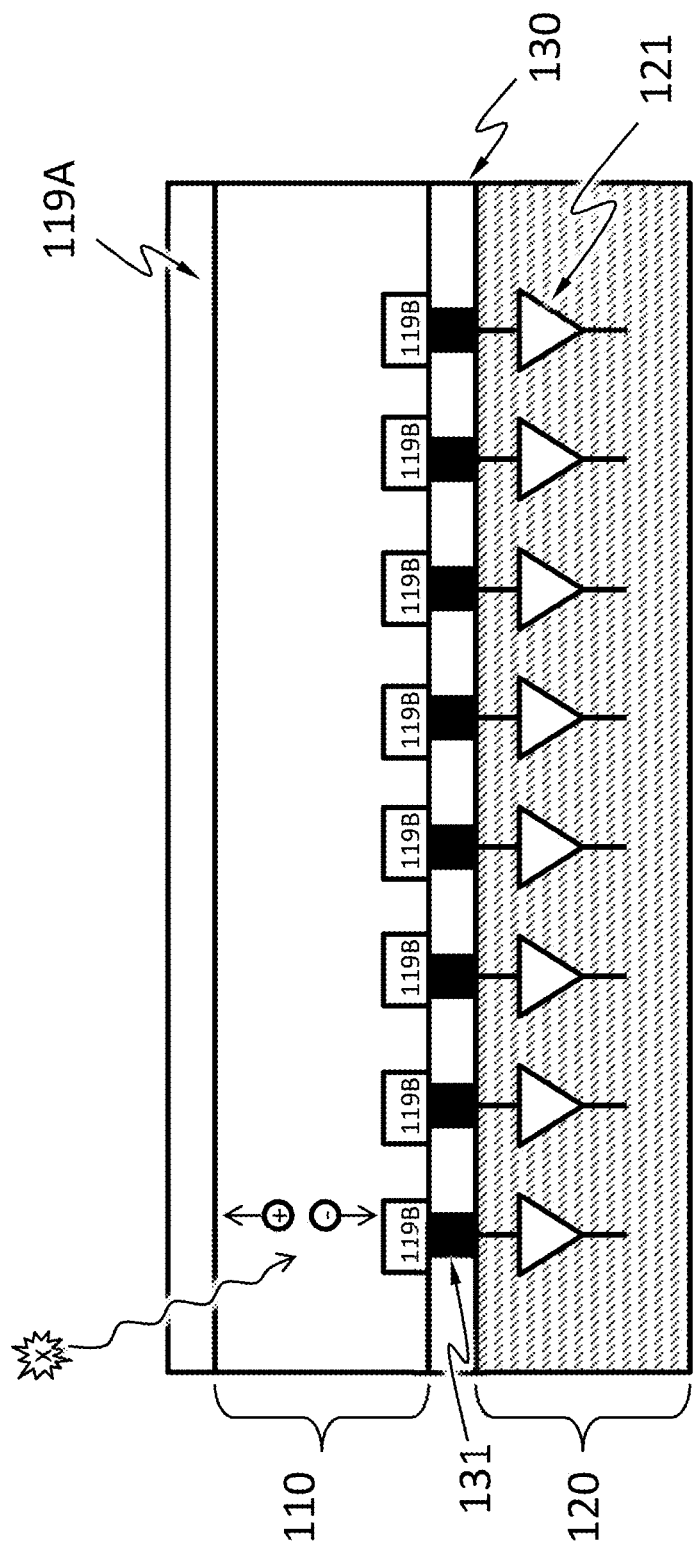
FIG. 1C schematically shows an alternative detailed cross-sectional view of the radiation detector, according to an embodiment.

As shown in an alternative detailed cross-sectional view of the radiation detector 100 in FIG. 1C, according to an embodiment, the radiation absorption layer 110 may include a resistor of a semiconductor material such as, silicon, germanium, GaAs, CdTe, CdZnTe, or a combination thereof, but does not include a diode. The semiconductor may have a high mass attenuation coefficient for the radiation energy of interest.

When a radiation particle hits the radiation absorption layer 110 including a resistor but not diodes, it may be absorbed by the radiation absorption layer 110, and one or more charge carriers may be generated in the radiation absorption layer 110 by a number of mechanisms. A radiation particle may generate 10 to 100000 charge carriers. The charge carriers may drift to the electrical contacts 119A and 119B under an electric field. The field may be an external electric field. The electrical contact 119B includes discrete portions. In an embodiment, the charge carriers may drift in directions such that the charge carriers generated by a single radiation particle are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by a radiation particle incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by a radiation particle incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

The electronics layer 120 may include an electronic system 121 suitable for processing or interpreting signals generated by radiation particles incident on the radiation absorption layer 110. The electronic system 121 may include an analog circuitry such as a filter network, amplifiers, integrators, and comparators, or a digital circuitry such as a microprocessor, and a memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the radiation absorption layer 110. Other bonding techniques are possible to connect the electronic system 121 to the pixels without using vias.

Figure 2:
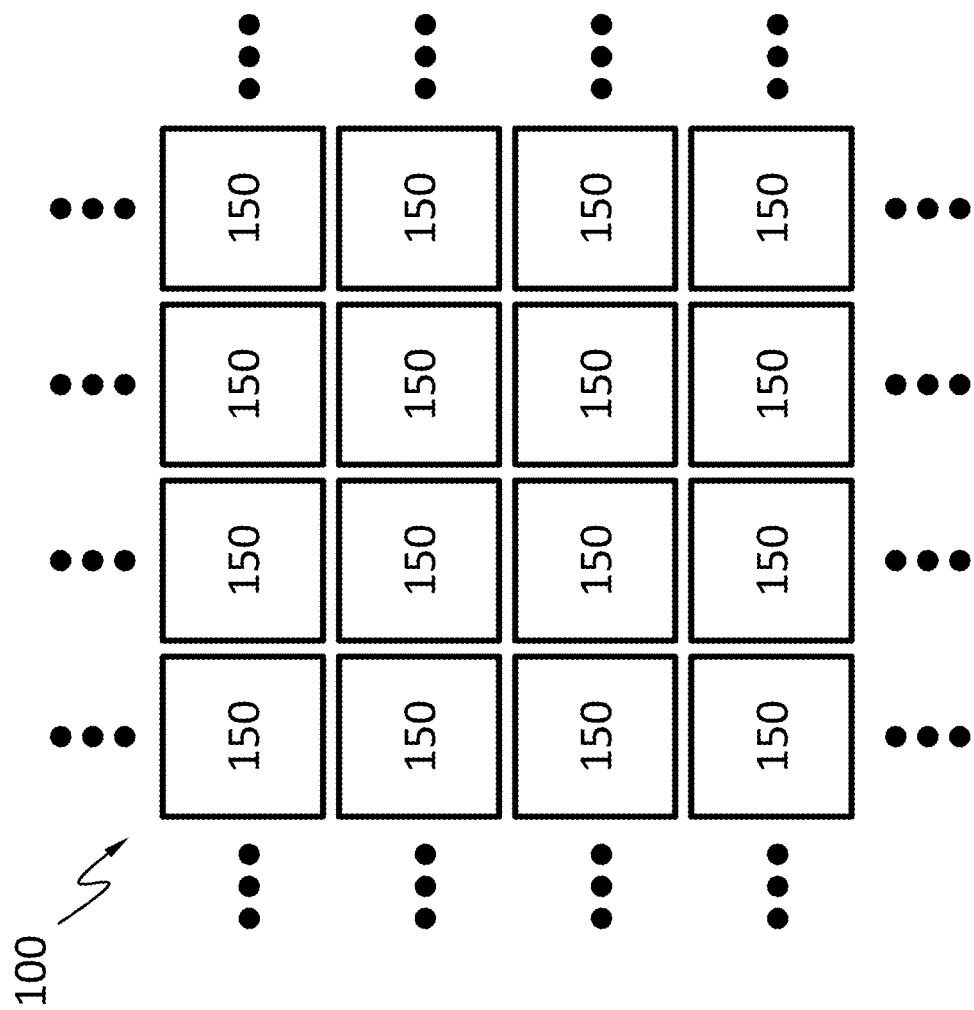
FIG. 2 schematically shows that the radiation detector may have an array of pixels, according to an embodiment.

FIG. 2 schematically shows that the radiation detector 100 may have an array of pixels 150, according to an embodiment. The array may be a rectangular array, a honeycomb array, a hexagonal array or any other suitable array. Each pixel 150 may be configured to detect a radiation particle incident thereon, measure the energy of the radiation particle, or both. For example, each pixel 150 may be configured to count numbers of radiation particles incident thereon whose energy falls in a plurality of bins, within a period of time. All the pixels 150 may be configured to count the numbers of radiation particles incident thereon within a plurality of bins of energy within the same period of time. Each pixel 150 may have its own analog-to-digital converter (ADC) configured to digitize an analog signal representing the energy of an incident radiation particle into a digital signal. The ADC may have a resolution of 10 bits or higher. Each pixel 150 may be configured to measure its dark current, such as before or concurrently with each radiation particle incident thereon. Each pixel 150 may be configured to deduct the contribution of the dark current from the energy of the radiation particle incident thereon. The pixels 150 may be configured to operate in parallel. For example, when one pixel 150 measures an incident radiation particle, another pixel 150 may be waiting for a radiation particle to arrive. The pixels 150 may be but do not have to be individually addressable. The radiation detector 100 may not have guard rings encompassing the pixels 150. The radiation detector 100 may not have sidewall doping that is configured to reduce leakage current on the sidewall of the radiation absorption layer 110.

FIG. 3 schematically shows the electronics layer 120, according to an embodiment. The electronics layer 120 comprises a substrate 122 having a first surface 124 and a second surface 198. A "surface" as used herein is not necessarily exposed, but can be buried wholly or partially. The electronics layer 120 comprises one or more electric contacts 125 on the first surface 124. The one or more electric contacts 125 may be configured to be electrically connected to one or more electrical contacts 119B of the radiation absorption layer 110. The electronics system 121 may be in or on the substrate 122.

The substrate 122 may be a thinned substrate. For example, the substrate may have at thickness of 750 microns or less, 200 microns or less, 100 microns or less, 50 microns or less, 20 microns or less, or 5 microns or less. The substrate 122 may be a silicon substrate or a substrate or other suitable semiconductor or insulator. The substrate 122 may be produced by grinding a thicker substrate to a desired thickness.

The one or more electric contacts 125 may be a layer of metal or doped semiconductor. For example, the electric contacts 125 may be gold, copper, platinum, palladium, doped silicon, etc.

FIG. 3 schematically shows bonding between the radiation absorption layer 110 and the electronics layer 120 at the electrical contact 119B of the radiation absorption layer 110 and electrical contacts 125 of the electronics layer 120. The bonding may be by a suitable technique such as direct bonding or flip chip bonding. The electronics layer 120 may have transmission lines 127 configured to power, control or communicate with the electronic system 121.

Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 199 deposited onto contact pads (e.g., the electrical contact 119B of the radiation absorption layer 110 or the electrical contacts 125). Either the radiation absorption layer 110 or the electronics layer 120 is flipped over and the electrical contact 119B of the radiation absorption layer 110 are aligned to the electrical contacts 125. The solder bumps 199 may be melted to solder the electrical contact 119B and the electrical contacts 125 together. Any void space among the solder bumps 199 may be filled with an insulating material.

FIG. 4A schematically shows a top view and a cross-sectional view of a radiation detector 100, according to an embodiment. The radiation detector 100 may have an active area 190, which is where the pixels 150 are located. The active area 190 is the area of the radiation detector 100 in which radiation incident therein may be detected by the radiation detector 100. According to an embodiment, the active area 190 extends to all but one of the edges of that radiation detector 100. Namely, the radiation detectors 100 may comprise a perimeter zone 195 along one edge of the radiation detector 100 but does not comprise a perimeter zone 195 along any other edge. The perimeter zone 195 is an area along an edge of the electronics layer 120 that may not be covered by the active area 190 of the radiation detector 100. The perimeter zone 195 may accommodate a flexible PCB 140 and a plurality of bonding pads 145 on the same side of the electronics layer 120 with the radiation absorption layer 110. The term "PCB" as used herein is not limited to a particular material. For example, a PCB may include a semiconductor. One end of the flexible PCB 140 may be mounted to the electronics layer 120 by bonding with the plurality of bonding pads 145. The electronic system 121 of the electronics layer 120 may be connected electrically to the bonding pads 145 by the transmission lines 127 on the first surface 124 of or inside the electronics layer 120. The radiation absorption layer 110 and the flexible PCB 140 may be mounted on the same side of the electronics layer 120. Radiation incident on the perimeter zones 195 of the radiation detectors 100, or on the flexible PCB 140 cannot be detected by the radiation detector 100.

Figure 4B:
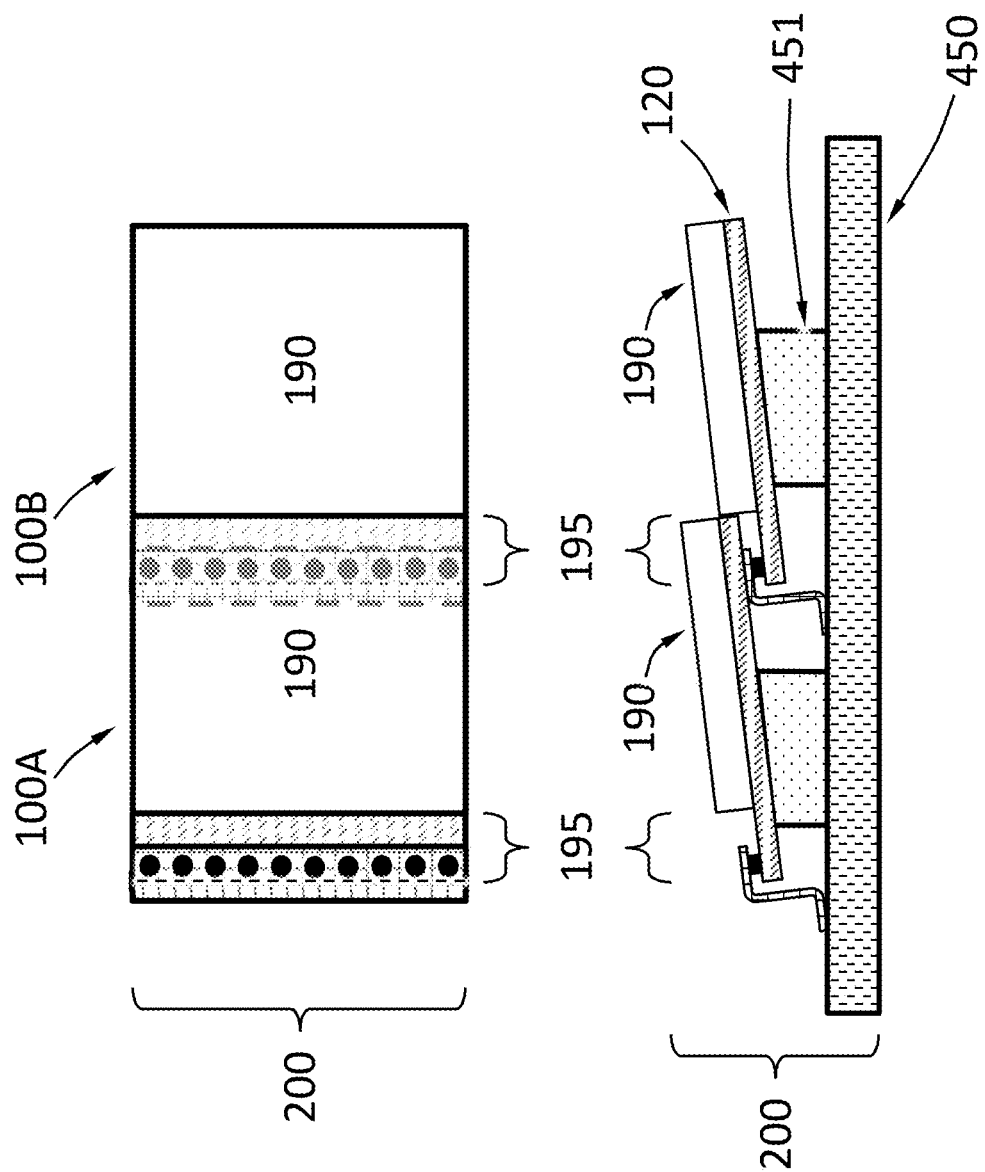
FIG. 4B schematically shows a top-view and across-sectional view of an image sensor, where a plurality of the radiation detectors of FIG. 4A are mounted to a system PCB, according to an embodiment.

FIG. 4B schematically shows a top view and a cross-sectional view of an image sensor 200, according to an embodiment. The image sensor 200 may comprise a first radiation detector 100A and a second radiation detector 100B, both of which may be mounted on a system PCB 450. The first radiation detector 100A and the second radiation detector 100B are tilted relative to the system PCB 450, by fixtures 451 between each of the first radiation detector 100A and the second radiation detector 100B and the system PCB 450. The perimeter zone 195 and the flexible PCB 140 of the second radiation detector 100B is tucked under the neighboring first radiation detector 100A such that the perimeter zone 195 and the flexible PCB 140 of the second radiation detector 100B are completely shadowed by the active area 190 of the first radiation detector 100A, according to one embodiment.

Figure 4C:
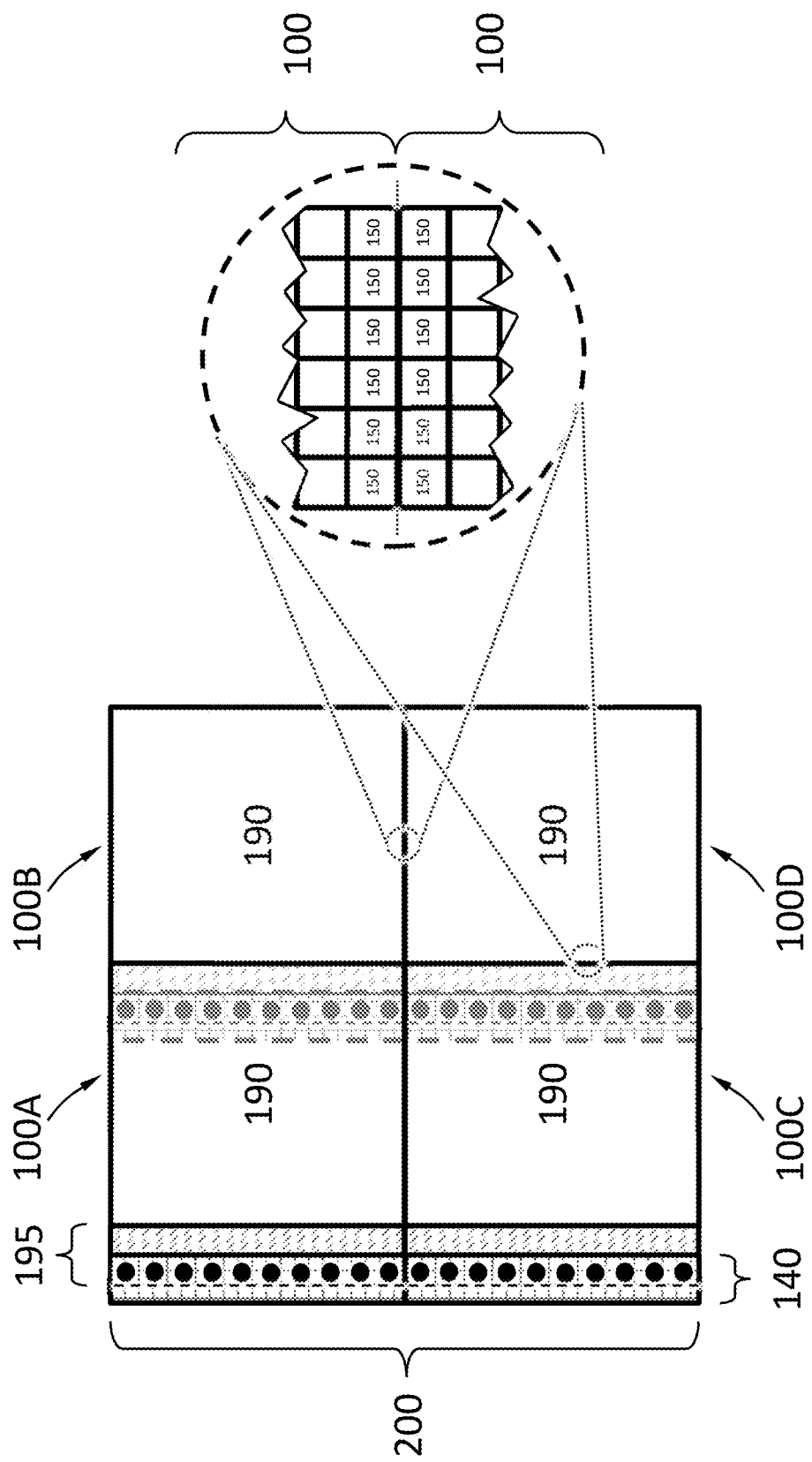
FIG. 4C schematically shows a top view of an image sensor, where a plurality of the detectors of FIG. 4A are positioned adjacent to each other, according to an embodiment.

FIG. 4C schematically shows a top view of the image sensor 200, wherein radiation detectors may be arranged close to each other, according to an embodiment. For example, the active area 190 of the first radiation detector 100A may completely cover the perimeter zone 195 and the flexible PCB 140 of the second radiation detector 100B. A gap between the active areas 190 of the first radiation detector 100A and the second radiation detector 110B is not wider than one pixel 150. The image sensor 200 may further include a third radiation detector 100C and a fourth radiation detector 100D. The active area 190 of the third radiation detector 100C may completely cover the perimeter zone 195 and the flexible PCB 140 of the fourth radiation detector 100D. The active area 190 of the first radiation detector 100A may be adjacent to the active area 190 of the third radiation detector 100C; the active area 190 of the second radiation detector 100B may be adjacent to the active area 190 of the fourth radiation detector 100D. The active area 190 of the third radiation detector 100C may be arranged close to the active area 190 of the first radiation detector 100A. The gap between the active areas 190 of the third radiation detector 100C and the active areas 190 of the first radiation detector 100A is not wider than one pixel 150; the gap between the active areas 190 of the fourth radiation detector 100D and the active areas 190 of the second radiation detector 100B is not wider than one pixel 150.

FIG. 5A, FIG. 5B, and FIG. 5C schematically respectively show a cross-sectional view, a top view and a bottom view of the radiation detector 100, according to another embodiment. The radiation detector 100 may comprise the radiation absorption layer 110, the electronics layer 120, wherein the radiation absorption layer 110 is mounted on a first side of the electronics layer 120. As shown in FIG. 5A, the electronic systems 121 may be in the electronics layer 120, according to an embodiment. The electronic systems 121 may comprise electric circuitry that can collect, process, and interpret the signals generated in the radiation absorption layer 110, which may include electric contacts for pixels 150, and other circuitry and transmission lines to transmit and process electrical signals, as shown in FIG. 5B. A plurality of vias 129 at an edge of the electronics layer 120 are electrically connected to the electronic systems 121 by first transmission lines 127. The plurality of vias 129 are further electrically connected by second transmission lines 128, to a plurality of bonding pads 146 that are on a second side of the electronics layer 120, opposite the first side. The plurality of bonding pads 146 may be on the surface of the second side of the electronics layer 120, as shown in FIG. 5C. By the electrically connected path with first transmission line 127, second transmission line 128, the plurality of vias 129, the electronic systems 121 may be able to communicate with other circuitry outside the radiation detector 100.

Figure 5D:
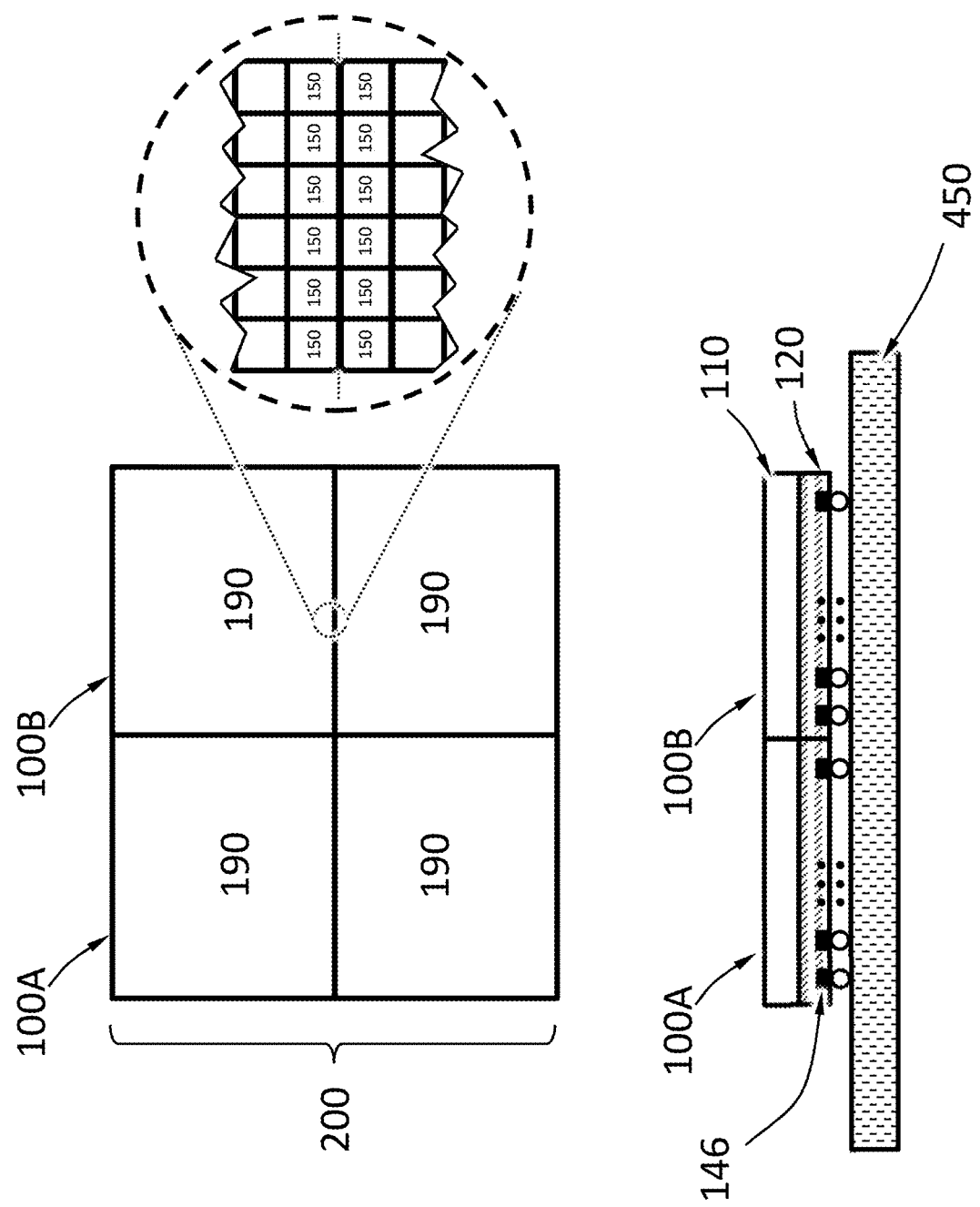
FIG. 5D schematically shows a top view and a cross-sectional view of the image sensor 200 including the radiation detectors of FIG. 5A, FIG. 5B, and FIG. 5C, according to an embodiment.

FIG. 5D schematically shows a top view and a cross-sectional view of the image sensor 200 including the radiation detectors 100 of FIG. 5A, FIG. 5B, and FIG. 5C, according to an embodiment. As shown in the cross-sectional view of the image sensor 200, the radiation detectors 100 may lay side-by-side on top of the system PCB 450, and electrically connected to the system PCB 450 by the plurality of vias 129. The plurality of vias 129 may be completely shadowed by the radiation absorption layer 110 of the radiation detector 100, according to one embodiment. Each of the radiation detectors of the image sensor 200 may be arranged very close to its neighboring radiation detectors, so that the gap between the active areas 190 of two adjacent radiation detectors is not wider than the pixel 150.

Figure 6A:
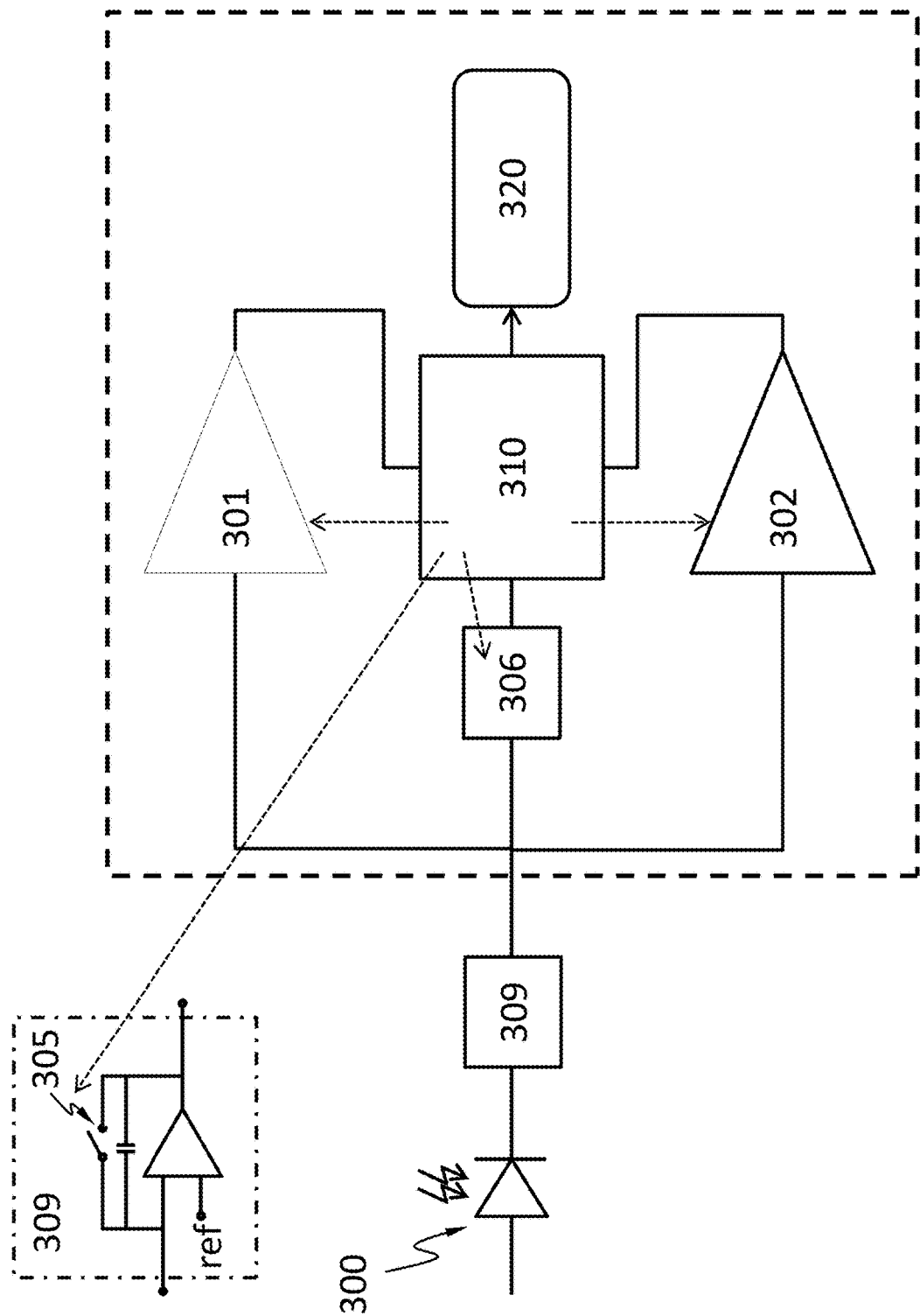
FIG. 6A and FIG. 6B each show a component diagram of an electronic system of the radiation detector in FIG. 1B or FIG. 1C, according to an embodiment.
Figure 6B:
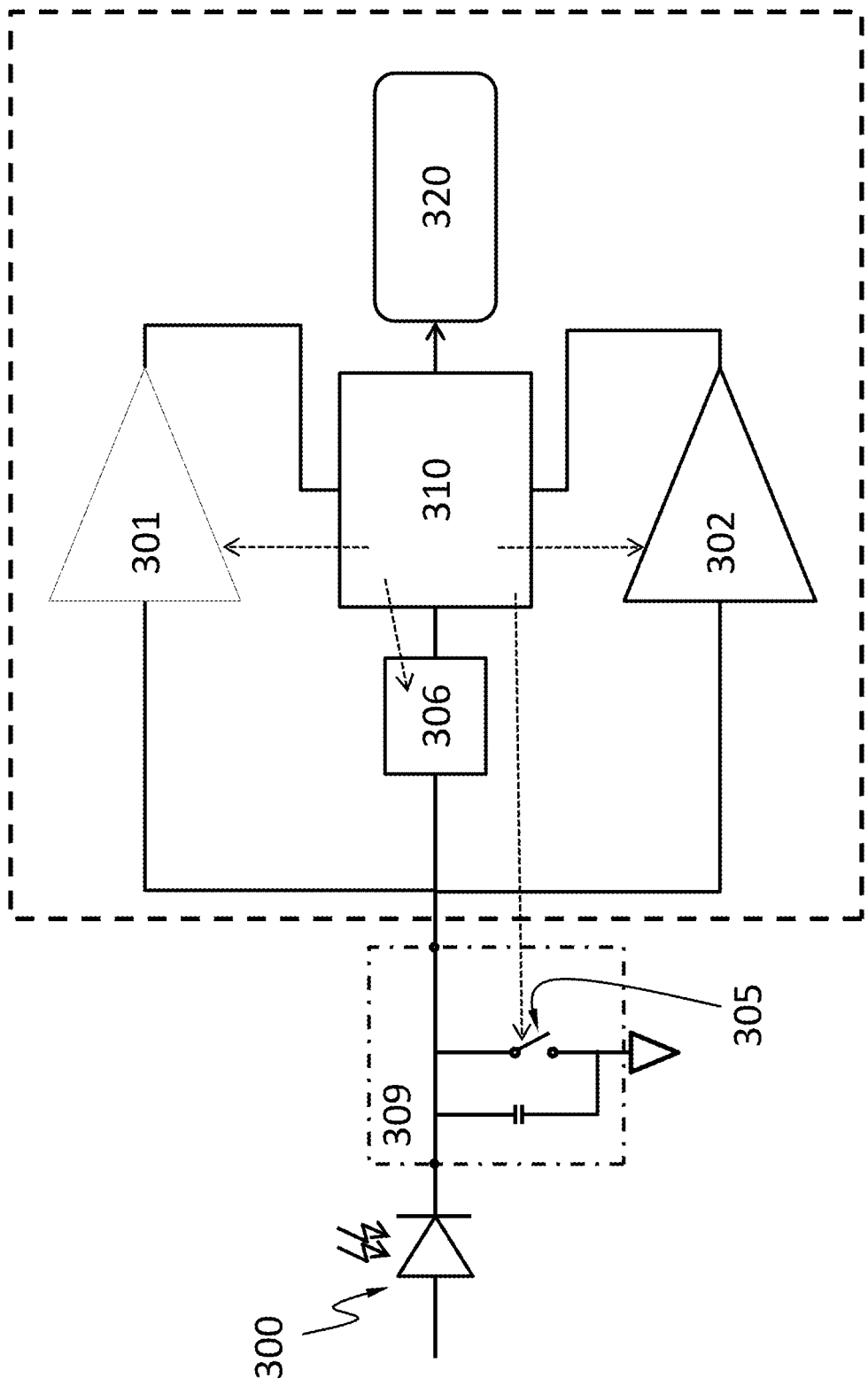

FIG. 6A and FIG. 6B each show a component diagram of the electronic system 121 of the radiation detector 100, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of an electrode of a diode 300 to a first threshold. The diode may be a diode formed by the first doped region 111, one of the discrete regions 114 of the second doped region 113, and the optional intrinsic region 112. Alternatively, the first voltage comparator 301 is configured to compare the voltage of an electrical contact (e.g., a discrete portion of electrical contact 119B) to a first threshold. The first voltage comparator 301 may be configured to monitor the voltage directly, or calculate the voltage by integrating an electric current flowing through the diode or electrical contact over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident radiation particle. The first voltage comparator 301 configured as a continuous comparator is especially suitable when the incident radiation intensity is relatively high. The first voltage comparator 301 may be a clocked comparator, which has the benefit of lower power consumption. The first voltage comparator 301 configured as a clocked comparator may cause the system 121 to miss signals generated by some incident radiation particles. When the incident radiation intensity is low, the chance of missing an incident radiation particle is low because the time interval between two successive photons is relatively long. Therefore, the first voltage comparator 301 configured as a clocked comparator is especially suitable when the incident radiation intensity is relatively low. The first threshold may be 5-10%, 10%-20%, 20-30%, 30-40% or 40-50% of the maximum voltage one incident radiation particle may generate in the diode or the resistor. The maximum voltage may depend on the energy of the incident radiation particle (i.e., the wavelength of the incident radiation), the material of the radiation absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the diode or the electrical contact over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, & \text{if } x \geq 0 \\ -x, & \text{if } x \leq 0 \end{cases}.$$

The second threshold may be 200%-300% of the first threshold. The second threshold may be at least 50% of the maximum voltage one incident radiation particle may generate in the diode or resistor. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident radiation. However, having a high speed is often at the cost of power consumption.

The counter 320 is configured to register a number of radiation particles reaching the diode or resistor. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode or which electrical contact is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the electrode to an electrical ground, so as to reset the voltage and discharge any charge carriers accumulated on the electrode. In an embodiment, the electrode is connected to an electrical ground after the expiration of the time delay. In an embodiment, the electrode is connected to an electrical ground for a finite reset time period. The controller 310 may connect the electrode to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

Figure 7:
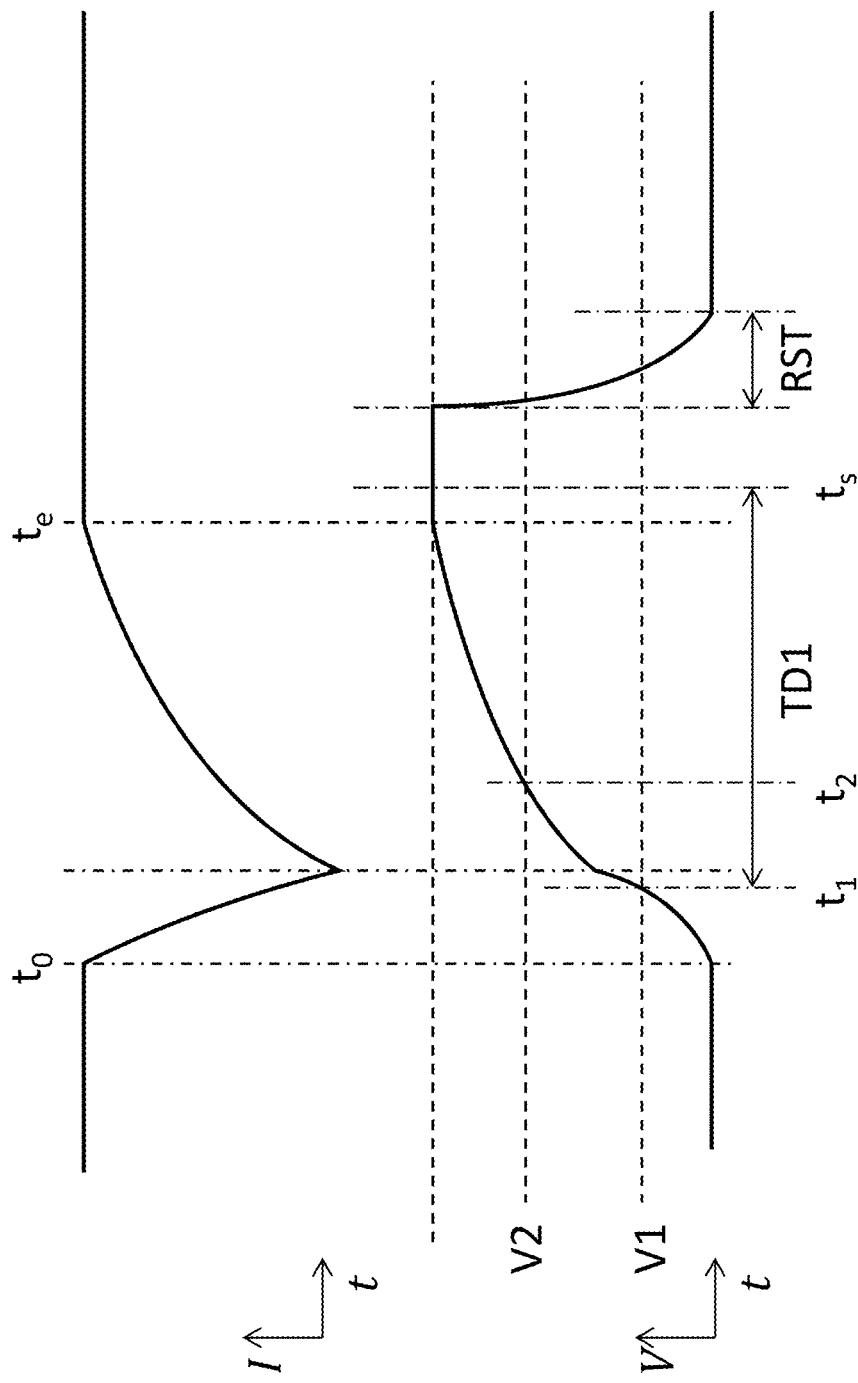
FIG. 7 schematically shows a temporal change of the electric current flowing through an electrode (upper curve) of a diode or an electrical contact of a resistor of a radiation absorption layer exposed to radiation, the electric current caused by charge carriers generated by a radiation particle incident on the radiation absorption layer, and a corresponding temporal change of the voltage of the electrode (lower curve), according to an embodiment.
Figure 8:
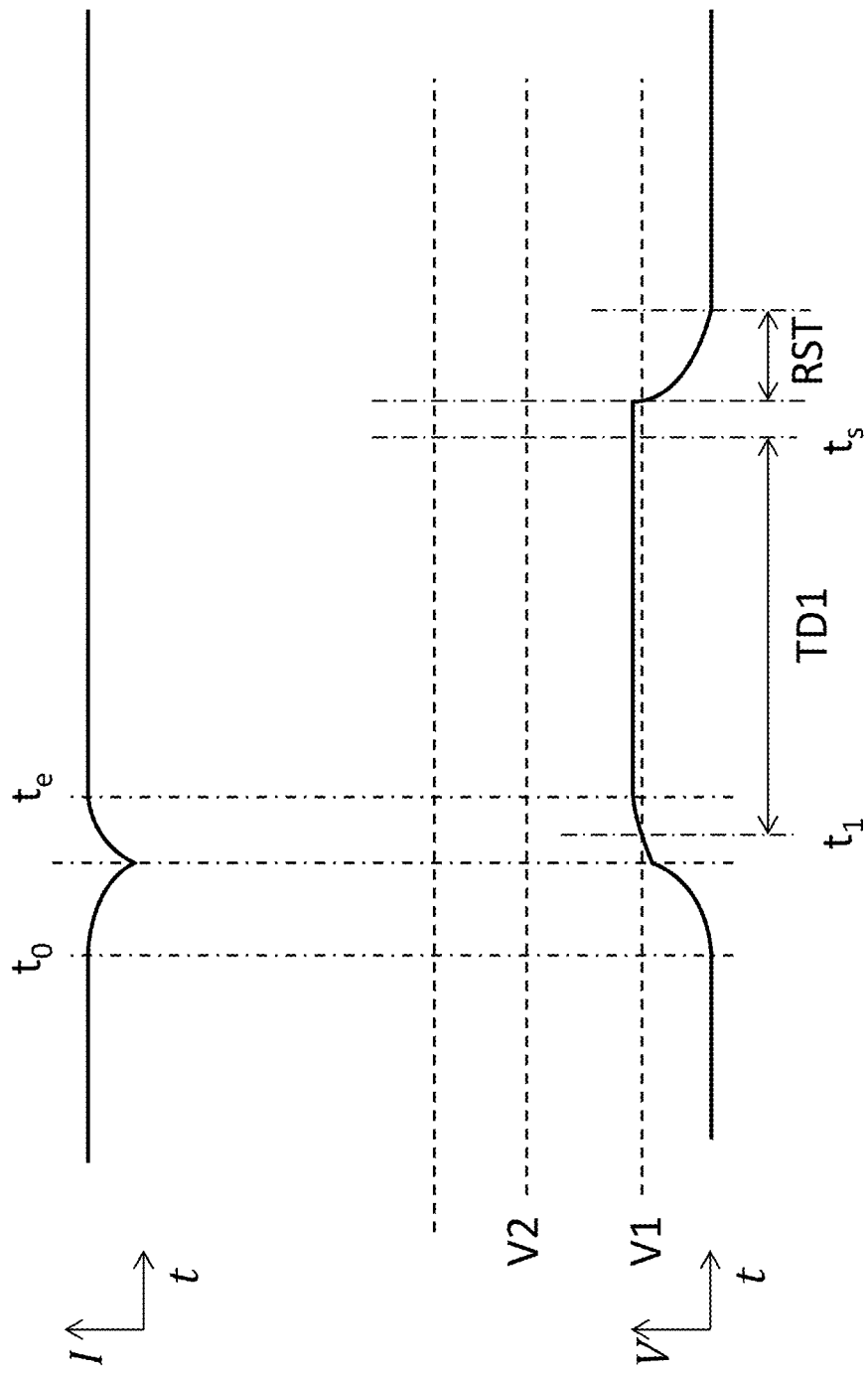
FIG. 8 schematically shows a temporal change of the electric current flowing through the electrode (upper curve) caused by noise (e.g., dark current), and a corresponding temporal change of the voltage of the electrode (lower curve), in the electronic system operating in the way shown in FIG. 7, according to an embodiment.

The system 121 may include a capacitor module 309 electrically connected to the electrode of the diode 300 or which electrical contact, wherein the capacitor module is configured to collect charge carriers from the electrode. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown in FIG. 7, between $t_0$ to $t_1$, or $t_1$-$t_2$). After the integration period has expired, the capacitor voltage is sampled and then reset by a reset switch. The capacitor module can include a capacitor directly connected to the electrode.

FIG. 7 schematically shows a temporal change of the electric current flowing through the electrode (upper curve) caused by charge carriers generated by a radiation particle incident on the diode or the resistor, and a corresponding temporal change of the voltage of the electrode (lower curve). The voltage may be an integral of the electric current with respect to time. At time $t_0$, the radiation particle hits the diode or the resistor, charge carriers start being generated in the diode or the resistor, electric current starts to flow through the electrode of the diode or the resistor, and the absolute value of the voltage of the electrode or electrical contact starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the radiation particle drift out of the radiation absorption layer 110. At time $t_s$, the time delay TD1 expires. In the example of FIG. 7, time $t_s$ is after time $t_e$; namely TD1 expires after all charge carriers generated by the radiation particle drift out of the radiation absorption layer 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by a radiation particle, which relates to the energy of the radiation particle. The controller 310 may be configured to determine the energy of the radiation particle based on voltage the voltmeter 306 measures. One way to determine the energy is by binning the voltage. The counter 320 may have a subcounter for each bin. When the controller 310 determines that the energy of the radiation particle falls in a bin, the controller 310 may cause the number registered in the sub-counter for that bin to increase by one. Therefore, the system 121 may be able to detect a radiation image and may be able to resolve radiation particle energies of each radiation particle.

After TD1 expires, the controller 310 connects the electrode to an electric ground for a reset period RST to allow charge carriers accumulated on the electrode to flow to the ground and reset the voltage. After RST, the system 121 is ready to detect another incident radiation particle. Implicitly, the rate of incident radiation particles the system 121 can handle in the example of FIG. 7 is limited by 1/(TD1+RST). If the first voltage comparator 301 has been deactivated, the controller 310 can activate it at any time before RST expires. If the controller 310 has been deactivated, it may be activated before RST expires.

FIG. 7 schematically shows a temporal change of the electric current flowing through the electrode (upper curve)

caused by noise (e.g., dark current, background radiation, scattered radiations, fluorescent radiations, shared charges from adjacent pixels), and a corresponding temporal change of the voltage of the electrode (lower curve), in the system 121 operating in the way shown in FIG. 7. At time to, the noise begins. If the noise is not large enough to cause the absolute value of the voltage to exceed the absolute value of V1, the controller 310 does not activate the second voltage comparator 302. If the noise is large enough to cause the absolute value of the voltage to exceed the absolute value of V1 at time $t_1$ as determined by the first voltage comparator 301, the controller 310 starts the time delay TD1 and the controller 310 may deactivate the first voltage comparator 301 at the beginning of TD1. During TD1 (e.g., at expiration of TD1), the controller 310 activates the second voltage comparator 302. The noise is very unlikely large enough to cause the absolute value of the voltage to exceed the absolute value of V2 during TD1. Therefore, the controller 310 does not cause the number registered by the counter 320 to increase. At time $t_e$, the noise ends. At time $t_s$, the time delay TD1 expires. The controller 310 may be configured to deactivate the second voltage comparator 302 at expiration of TD1. The controller 310 may be configured not to cause the voltmeter 306 to measure the voltage if the absolute value of the voltage does not exceed the absolute value of V2 during TD1. After TD1 expires, the controller 310 connects the electrode to an electric ground for a reset period RST to allow charge carriers accumulated on the electrode as a result of the noise to flow to the ground and reset the voltage. Therefore, the system 121 may be very effective in noise rejection.

Figure 9:
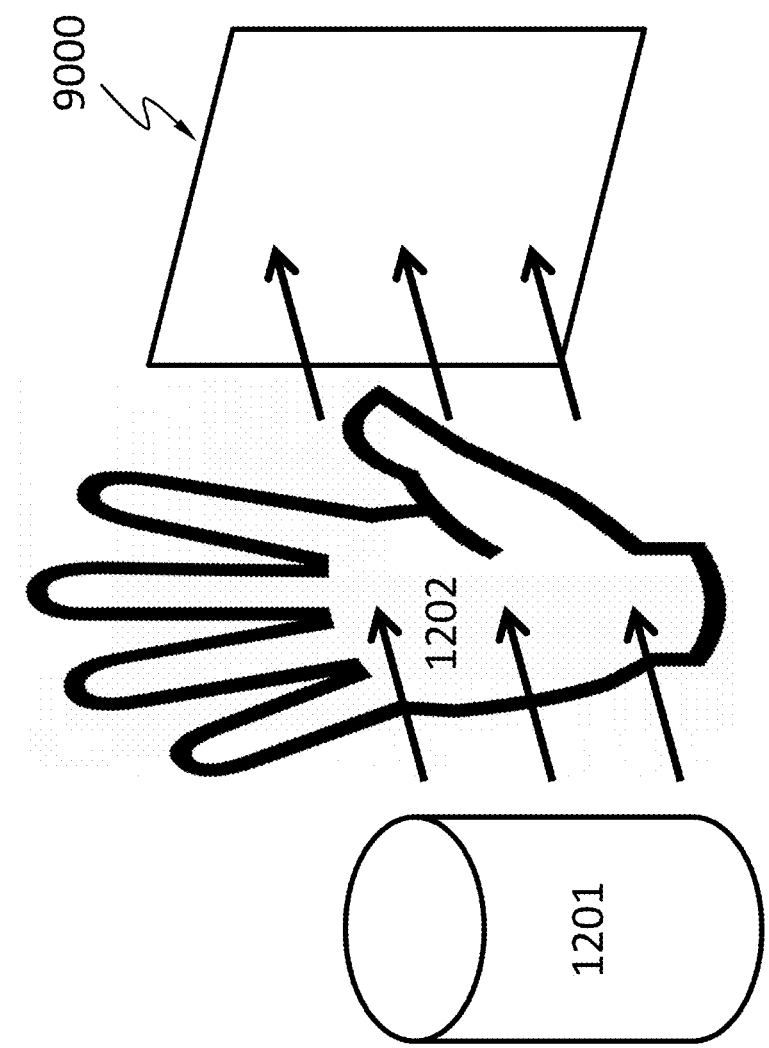
FIG. 9 schematically shows a system comprising the image sensor described herein, suitable for medical imaging such as chest radiography, abdominal radiography, etc., according to an embodiment.

FIG. 9 schematically shows a system comprising an image sensor 9000 as described in relation to FIG. 4B-FIG. 4C or FIG. 5D. The system may be used for medical imaging such as chest radiation radiography, abdominal radiation radiography, etc. The system comprises a radiation source 1201. Radiation emitted from the radiation source 1201 penetrates an object 1202 (e.g., a human body part such as chest, limb, abdomen), is attenuated by different degrees by the internal structures of the object 1202 (e.g., bones, muscle, fat and organs, etc.), and is projected to the image sensor 9000. The image sensor 9000 forms an image by detecting the intensity distribution of the radiation.

Figure 10:
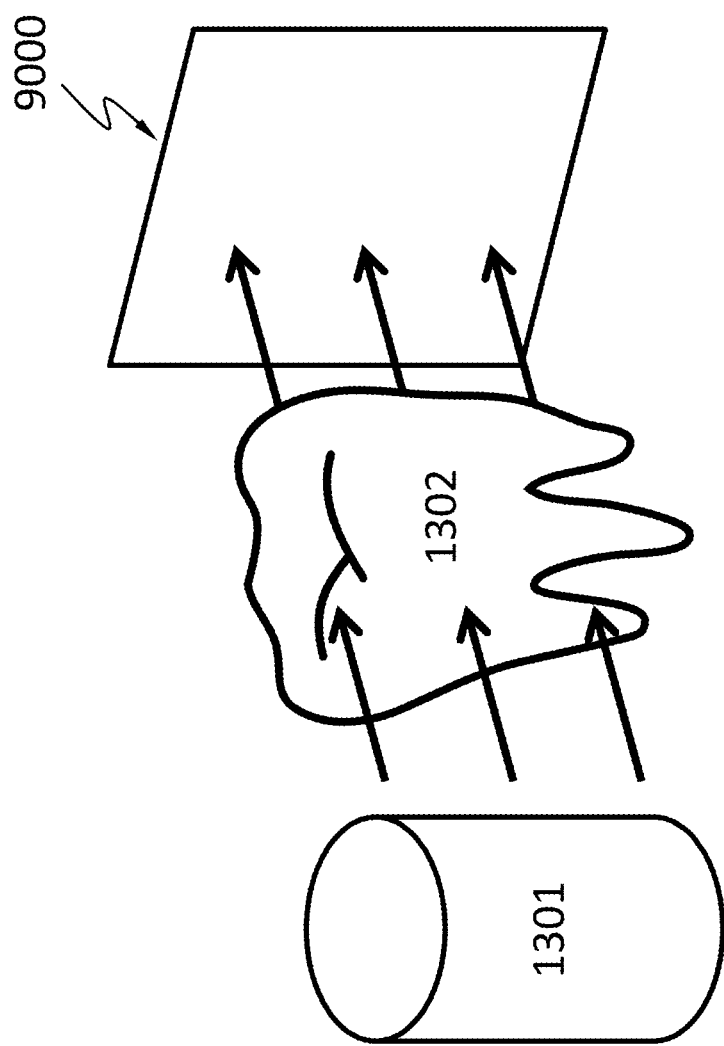
FIG. 10 schematically shows a system comprising the image sensor described herein suitable for dental radiography, according to an embodiment.

FIG. 10 schematically shows a system comprising an image sensor 9000 as described in relation to FIG. 4B-FIG. 4C or FIG. 5D. The system may be used for medical imaging such as dental radiation radiography. The system comprises a radiation source 1301. Radiation emitted from the radiation source 1301 penetrates an object 1302 that is part of a mammal (e.g., human) mouth. The object 1302 may include a maxilla bone, a palate bone, a tooth, the mandible, or the tongue. The radiation is attenuated by different degrees by the different structures of the object 1302 and is projected to the image sensor 9000. The image sensor 9000 forms an image by detecting the intensity distribution of the radiation. Teeth absorb radiation more than dental caries, infections, periodontal ligament. The dosage of radiation received by a dental patient is typically small (around 0.150 mSv for a full mouth series).

Figure 11:
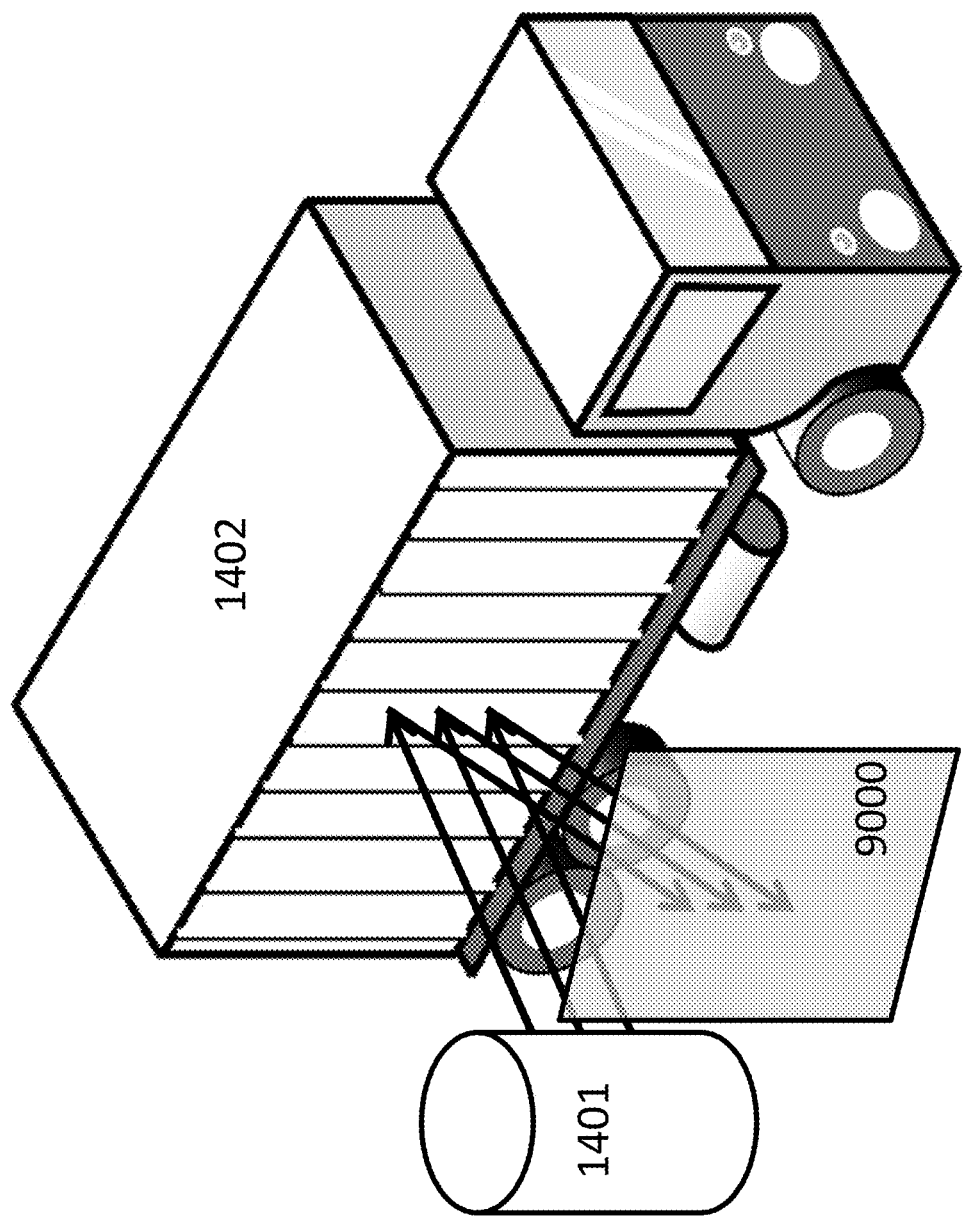
FIG. 11 schematically shows a cargo scanning or non-intrusive inspection (NII) system comprising the image sensor described herein, according to an embodiment.

FIG. 11 schematically shows a cargo scanning or non-intrusive inspection (NII) system comprising an image sensor 9000 as described in relation to FIG. 4B-FIG. 4C or FIG. 5D. The system may be used for inspecting and identifying goods in transportation systems such as shipping containers, vehicles, ships, luggage, etc. The system comprises a radiation source 1401. Radiation emitted from the radiation source 1401 may backscatter from an object 1402 (e.g., shipping containers, vehicles, ships, etc.) and be projected to the image sensor 9000. Different internal structures of the object 1402 may backscatter radiation differently. The image sensor 9000 forms an image by detecting the intensity distribution of the backscattered radiation and/or energies of the backscattered radiation particles.

Figure 12:
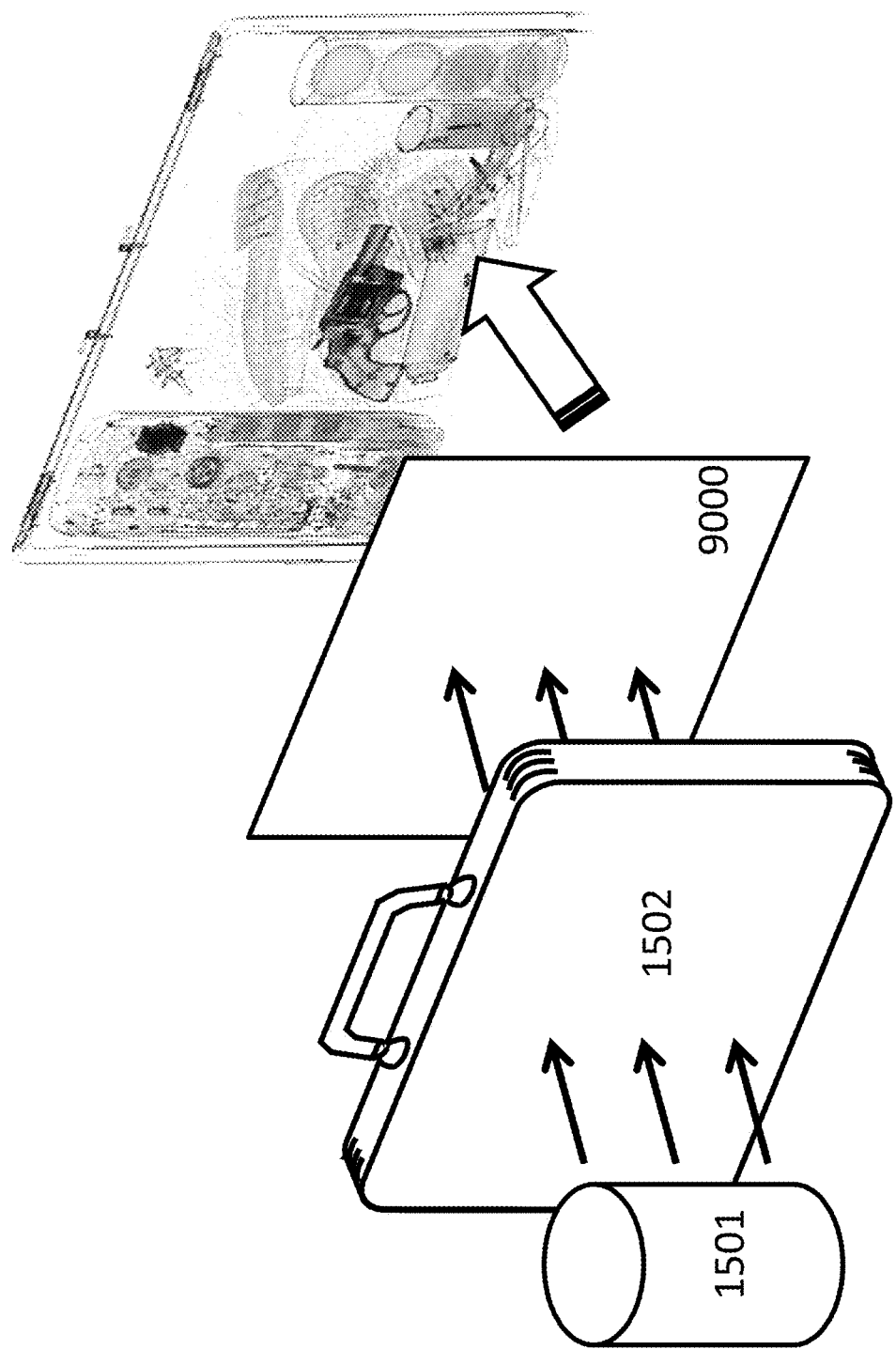
FIG. 12 schematically shows another cargo scanning or non-intrusive inspection (NII) system comprising the image sensor described herein, according to an embodiment.

FIG. 12 schematically shows another cargo scanning or non-intrusive inspection (NII) system comprising an image sensor 9000 as described in relation to FIG. 4B-FIG. 4C or FIG. 5D. The system may be used for luggage screening at public transportation stations and airports. The system comprises a radiation source 1501. Radiation emitted from the radiation source 1501 may penetrate a piece of luggage 1502, be differently attenuated by the contents of the luggage, and projected to the image sensor 9000. The image sensor 9000 forms an image by detecting the intensity distribution of the transmitted radiation. The system may reveal contents of luggage and identify items forbidden on public transportation, such as firearms, narcotics, edged weapons, flammables.

Figure 13:
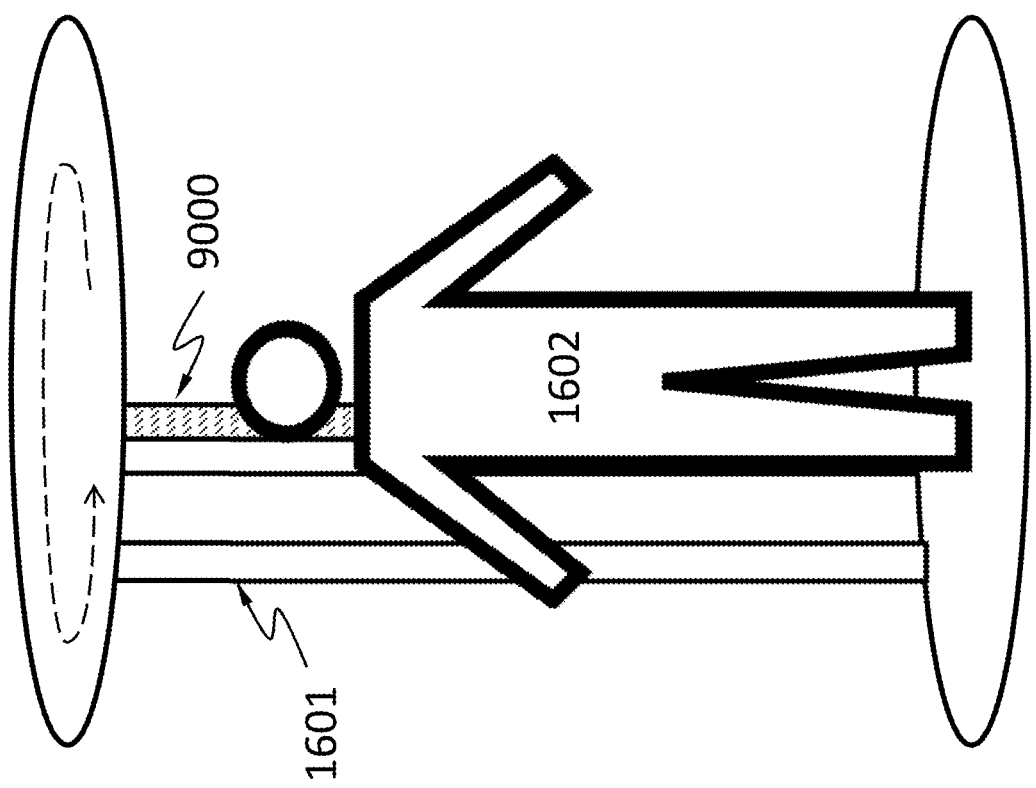
FIG. 13 schematically shows a full-body scanner system comprising the image sensor described herein, according to an embodiment.

FIG. 13 schematically shows a full-body scanner system comprising an image sensor 9000 as described in relation to FIG. 4B-FIG. 4C or FIG. 5D. The full-body scanner system may detect objects on a person's body for security screening purposes, without physically removing clothes or making physical contact. The full-body scanner system may be able to detect non-metal objects. The full-body scanner system comprises a radiation source 1601. Radiation emitted from the radiation source 1601 may backscatter from a human 1602 being screened and objects thereon, and be projected to the image sensor 9000. The objects and the human body may backscatter radiation differently. The image sensor 9000 forms an image by detecting the intensity distribution of the backscattered radiation. The image sensor 9000 and the radiation source 1601 may be configured to scan the human in a linear or rotational direction.

Figure 14:
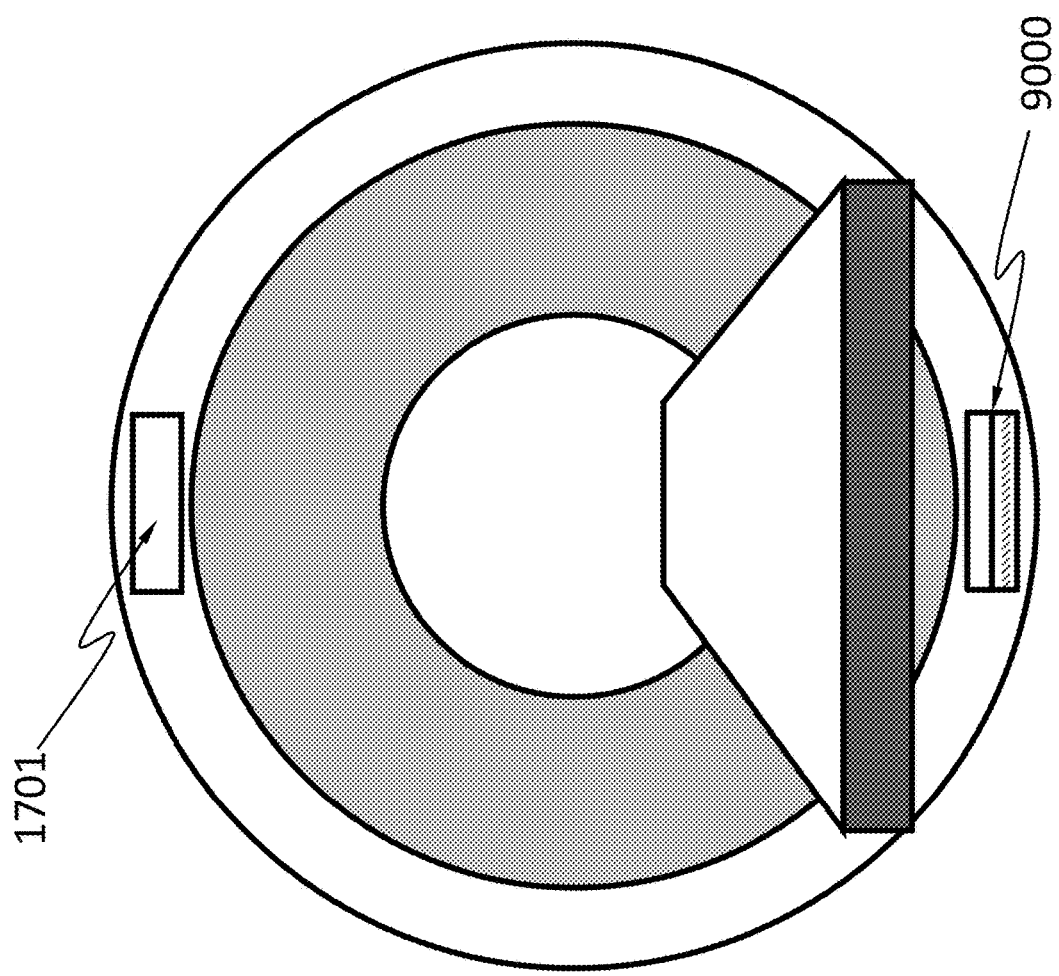
FIG. 14 schematically shows a radiation computed tomography (Radiation CT) system comprising the image sensor described herein, according to an embodiment.

FIG. 14 schematically shows a radiation computed tomography (Radiation CT) system. The Radiation CT system uses computer-processed radiations to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The Radiation CT system comprises an image sensor 9000 as described in relation to FIG. 4B-FIG. 4C or FIG. 5D and a radiation source 1701. The image sensor 9000 and the radiation source 1701 may be configured to rotate synchronously along one or more circular or spiral paths.

Figure 15:
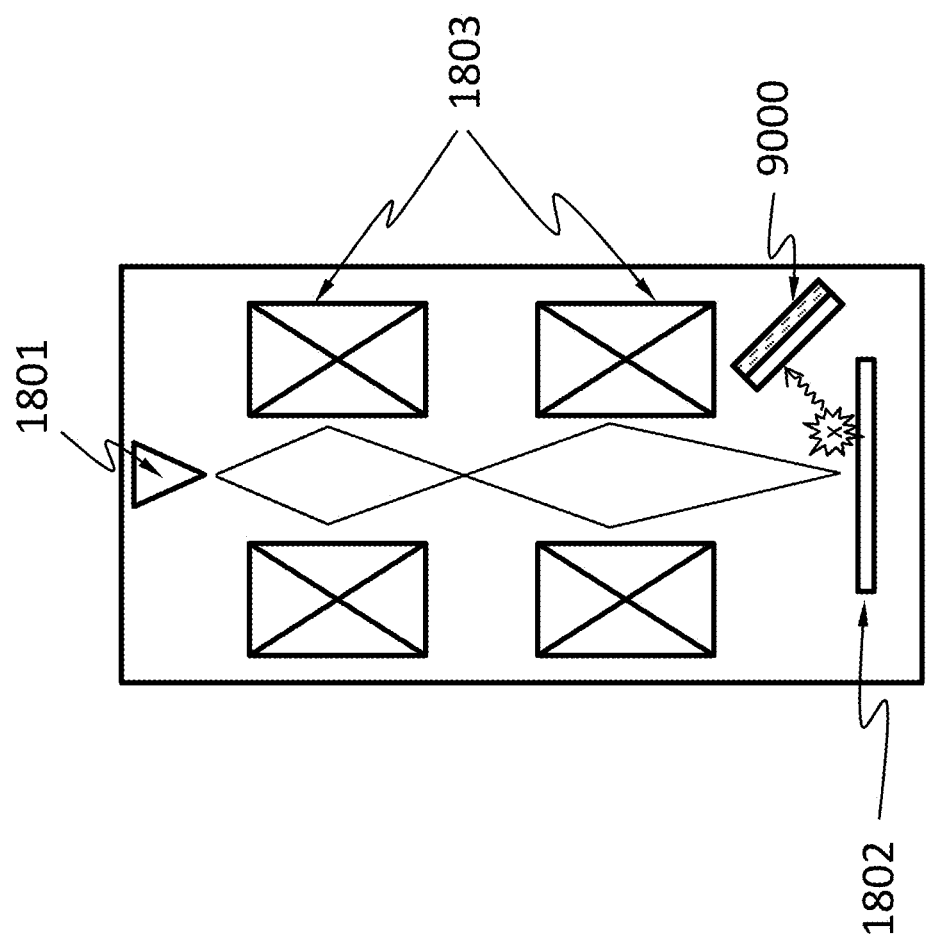
FIG. 15 schematically shows an electron microscope comprising the image sensor described herein, according to an embodiment.

FIG. 15 schematically shows an electron microscope. The electron microscope comprises an electron source 1801 (also called an electron gun) that is configured to emit electrons. The electron source 1801 may have various emission mechanisms such as thermionic, photocathode, cold emission, or plasmas source. The emitted electrons pass through an electronic optical system 1803, which may be configured to shape, accelerate, or focus the electrons. The electrons then reach a sample 1802 and an image detector may form an image therefrom. The electron microscope may comprise an image sensor 9000 as described in relation to FIG. 4B-FIG. 4C or FIG. 5D, for performing energy-dispersive X-ray spectroscopy (EDS). EDS is an analytical technique used for the elemental analysis or chemical characterization of a sample. When the electrons incident on a sample, they cause emission of characteristic X-rays from the sample. The incident electrons may excite an electron in an inner shell of an atom in the sample, ejecting it from the shell while creating an electron hole where the electron was. An electron from an outer, higher-energy shell then fills the hole, and the difference in energy between the higher-energy shell and the lower energy shell may be released in the form of an X-ray. The number and energy of the X-rays emitted from the sample can be measured by the image sensor 9000.

The image sensor 9000 described here may have other applications such as in a radiation telescope, radiation mammography, industrial radiation defect detection, radiation microscopy or microradiography, radiation casting inspection, radiation non-destructive testing, radiation weld inspection, radiation digital subtraction angiography, etc. It may be suitable to use this image sensor 9000 in place of a photographic plate, a photographic film, a PSP plate, a radiation image intensifier, a scintillator, or another semiconductor radiation detector.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A radiation detector comprising:
   a radiation absorption layer configured to generate electric signals by absorbing radiation particles;
   an electronics layer comprising an electronic system configured to process or interpret the signals;
   a flexible printed circuit board (PCB) configured to receive output from the electronic system;
   wherein the radiation absorption layer and the flexible PCB are mounted on a same side of the electronics layer;
   wherein the radiation detector comprises a perimeter zone along one edge of the radiation detector, and wherein the flexible PCB is mounted to the electronics layer at the perimeter zone;
   wherein the radiation detector does not comprise a perimeter zone along any other edges.

2. The radiation detector of claim 1,
   wherein the radiation absorption layer comprises an electrode;
   wherein the electronic system comprises:
   a first voltage comparator configured to compare a voltage of the electrode to a first threshold;
   a second voltage comparator configured to compare the voltage to a second threshold;
   a counter configured to register a number of radiation particles reaching the radiation absorption layer;
   a controller;
   wherein the controller is configured to start a time delay from a time at which the first voltage comparator determines that an absolute value of the voltage equals or exceeds an absolute value of the first threshold;
   wherein the controller is configured to activate the second voltage comparator during the time delay;
   wherein the controller is configured to cause the number registered by the counter to increase by one, when the second voltage comparator determines that an absolute value of the voltage equals or exceeds an absolute value of the second threshold.

3. The radiation detector of claim 2, wherein the electronics system further comprises a capacitor module electrically connected to the electrode, wherein the capacitor module is configured to collect charge carriers from the electrode.

4. The radiation detector of claim 2, wherein the controller is configured to activate the second voltage comparator at a beginning or expiration of the time delay.

5. The radiation detector of claim 2, wherein the electronics system further comprises a voltmeter, wherein the controller is configured to cause the voltmeter to measure the voltage upon expiration of the time delay.

6. The radiation detector of claim 2, wherein the controller is configured to determine a radiation particle energy based on a value of the voltage measured upon expiration of the time delay.

7. The radiation detector of claim 2, wherein a rate of change of the voltage is substantially zero at expiration of the time delay.

8. An image sensor comprising:
   a first radiation detector and a second radiation detector of claim 1, both mounted on a system printed circuit board (PCB);
   wherein the flexible PCB of the first radiation detector is shadowed by an active area of the second radiation detector.

9. The image sensor of claim 8, wherein the first radiation detector is tilted relative to the system PCB.

10. The image sensor of claim 8, wherein the first radiation detector is supported by a fixture between the first radiation detector and the system PCB.

11. The image sensor of claim 8, further comprising a third radiation detector of claim 1, positioned adjacent to the first radiation detector;
    wherein a gap between the third radiation detector and the first radiation detector is not wider than a pixel of the first radiation detector.

12. A system comprising the image sensor of claim 8 and a radiation source.

13. A radiation detector comprising:
    a radiation absorption layer configured to generate electric signals by absorbing radiation particles;
    an electronics layer comprising an electronic system configured to process or interpret the signals;
    wherein the radiation absorption layer is mounted on a first side of the electronics layer;
    wherein the electronics layer comprises a plurality of vias at an edge of the electronics layer, first transmission lines electrically connecting the electronic system to the plurality of vias, and second transmission lines electrically connecting the plurality of vias to a plurality of bonding pads on a second side of the electronics layer opposite the first side.

14. The radiation detector of claim 13, wherein the radiation absorption layer shadows the plurality of vias.

15. The radiation detector of claim 13,
    wherein the radiation absorption layer comprises an electrode;
    wherein the electronic system comprises:
    a first voltage comparator configured to compare a voltage of the electrode to a first threshold;
    a second voltage comparator configured to compare the voltage to a second threshold;
    a counter configured to register a number of radiation particles reaching the radiation absorption layer;
    a controller;
    wherein the controller is configured to start a time delay from a time at which the first voltage comparator determines that an absolute value of the voltage equals or exceeds an absolute value of the first threshold;
    wherein the controller is configured to activate the second voltage comparator during the time delay;

wherein the controller is configured to cause the number registered by the counter to increase by one, when the second voltage comparator determines that an absolute value of the voltage equals or exceeds an absolute value of the second threshold.

16. The radiation detector of claim 15, wherein the electronics system further comprises a capacitor module electrically connected to the electrode, wherein the capacitor module is configured to collect charge carriers from the electrode.

17. The radiation detector of claim 16, wherein the controller is configured to activate the second voltage comparator at a beginning or expiration of the time delay.

18. The radiation detector of claim 16, wherein the electronics system further comprises a voltmeter, wherein the controller is configured to cause the voltmeter to measure the voltage upon expiration of the time delay.

19. The radiation detector of claim 16, wherein the controller is configured to determine a radiation particle energy based on a value of the voltage measured upon expiration of the time delay.

20. The radiation detector of claim 16, wherein a rate of change of the voltage is substantially zero at expiration of the time delay.

21. The radiation detector of claim 13, wherein the plurality of vias are only at the edge but not in an interior of the electronics layer.

* * * * *